United States Patent
Asakawa et al.

(10) Patent No.: US 6,825,056 B2
(45) Date of Patent: Nov. 30, 2004

(54) LIGHT-EMITTING DEVICE AND METHOD FOR MANUFACTURING THE SAME

(75) Inventors: Koji Asakawa, Kanagawa-ken (JP); Akira Fujimoto, Kanagawa-ken (JP); Hitoshi Sugiyama, Kanagawa-ken (JP); Kenichi Ohashi, Kanagawa-ken (JP); Kenji Suzuki, Kanagawa-ken (JP); Junichi Tonotani, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/330,086

(22) Filed: Dec. 30, 2002

(65) Prior Publication Data
US 2003/0173568 A1 Sep. 18, 2003

(30) Foreign Application Priority Data
Dec. 28, 2001 (JP) ........................................ 2001-402004

(51) Int. Cl.$^7$ .............................................. H01L 21/00
(52) U.S. Cl. ............................................ 438/47; 438/46
(58) Field of Search ...................................... 438/46, 47

(56) References Cited

U.S. PATENT DOCUMENTS

| 6,248,847 B1 | | 6/2001 | Jung et al. | |
| 6,445,124 B1 | * | 9/2002 | Asai et al. ................... | 313/495 |
| 6,565,763 B1 | * | 5/2003 | Asakawa et al. .............. | 216/56 |
| 2002/0020946 A1 | * | 2/2002 | Hiraoka et al. .............. | 264/485 |
| 2002/0168548 A1 | * | 11/2002 | Sakurai et al. ........ | 428/694 BR |
| 2003/0222048 A1 | * | 12/2003 | Asakawa et al. .............. | 216/2 |

FOREIGN PATENT DOCUMENTS

| JP | 2002287377 | * | 3/2003 |
| KR | 9205778 | | 7/1992 |
| TW | 422939 | | 2/2001 |

* cited by examiner

*Primary Examiner*—Long Pham
(74) *Attorney, Agent, or Firm*—Oblon, Spivak, McClelland, Maier & Neustadt, P.C.

(57) ABSTRACT

A nanometer size roughened structure is formed on a surface of a light-emitting element, and luminous efficiency is improved. The roughened structure is formed into the following shape to change refractive index smoothly: (1) the mean diameter of projections on the roughened surface is smaller than the light wavelength; (2) a pitch of the roughened surface is irregular; and (3) positions of the top and bottom of the roughened surface are distributed from their mean values within the light wavelength. The surface of such light-emitting element is obtained by forming a thin film on the surface of the light-emitting element using a block or graft copolymer comprising resin composition and forms a self-assembled microphase-separated structure; selectively removing at least one phase of the microphase-separated structure; and etching the surface of the light-emitting element using the remaining phase as an etching mask.

14 Claims, 7 Drawing Sheets

LIGHT-EMITTING DEVICE AND METHOD FOR MANUFACTURING THE SAME

CROSSREFERENCE TO RELATED APLICATION

This application is based upon and claims the benefit of priority from the prior Japanese Patent Application No. 2001-402004, filed on Dec. 28, 2001; the entire contents of which are incorporated herein by reference.

BACKGROUND OF THE INVENTION

1. Field of the Invention

The present invention relates to a light-emitting device that is able to realize a high luminous efficiency by emitting a light generated in a light-emitting element with a high efficiency, and a method for manufacturing the same.

2. Description of the Related Art

Refractive indices of compound semiconductors constituting light-emitting devices are so high that much luminous energy is lost by reflection at the surface and interface of most of the light-emitting devices and the like. Therefore, it is difficult to emit the light generated within the element to outside. For example, since the compound semiconductor such as gallium phosphide (GaP) has a refractive index of as high as about 3.5, and only about 19% of the light generated in the semiconductor is emitted due to total reflection. For solving this problem, a monolayer with a refractive index of about 1.5 is formed on the surface of the light-emitting element or the like as an antireflective film. However, luminous efficiency is yet insufficient in this type of light-emitting device due to a relatively large refractive index difference between the light-emitting surface and the monolayer film.

It is contemplated to increase transmittance by forming ordered structures with a size of several nanometers on the surface of the light-emitting element, in order to enhance the light emission efficiency (see non-patent document 1 below). However, since it is almost the limit of photolithography even by using a latest eximer laser to form the ordered structure having a refraction preventive effect with a size of several nanometers, the structure should be formed by an electron beam and etching. Consequently, this method is not practically applicable due to its high cost and poor throughput. Moreover, the process for forming the nanometer size of ordered structures has small process window.

Another method known in the art for roughening the light-emitting surface is to treat the surface with hydrochloric acid, sulfuric acid, hydrogen peroxide or a mixed solution thereof (see patent documents 1 and 2 below). However, some crystal faces can be roughened while the other crystal surface cannot be roughened by this method by being affected by crystal orientation of the substrate. Accordingly, the light-emitting surface cannot be always roughened by this some limitations for increasing light emission efficiency.

[Non-patent document 1] Applied Physics Letters, 142, vol. 78, 2001; Jpn. J. Appl. Phys., L735, vol. 139, 2000
[Patent document 1] Japanese Patent Application Laid-open No. 2000-299494
[Patent document 2] Japanese Patent Application Laid-open No. 4-354382

SUMMARY OF THE INVENTION

According to a first aspect of the present invention, there is provided a method for manufacturing a light-emitting device comprising: forming a thin film on a surface of the light-emitting element using a resin composition which contains a block copolymer or graft copolymer and forms a microphase-separated structure in a self-organization manner; selectively removing at least one phase of the microphase separated structure of the thin film formed on the surface of the light-emitting element; and etching the surface of the light-emitting element using the remaining phase as an etching mask.

According to a second aspect of the present invention, there is provided a light-emitting element having a finely roughened structure on a surface of an inorganic light permeable layer formed on a surface of the outermost layer of a light-emitting side or on the outermost layer at the light-emitting side of the semiconductor layer constituting the light-emitting element, the surface having a surface property comprising the following two conditions:

(1) the mean radius of gyration <R> of projections in the roughened surface structure is $\frac{1}{20}$ or more and $\frac{1}{2}$ or less of the light wavelength, and dispersion $\sigma_R$ of the radius of gyration is 1.05 or more and 2 or less, wherein <R> is represented by <R>=$\Sigma R^2 n_R / \Sigma R n_R$) where $n_R$ denotes the number of projections having an arbitrary radius of gyration, and $\sigma_R$ is represented by $\sigma_R$=<R>/($\Sigma R n_R / \Sigma n_R$) where $n_R$ denotes the number of projections having an arbitrary radius of gyration; and (2) the mean height <H> of projections in the roughened surface structure is $\frac{1}{10}$ or more and 1 or less of the light wavelength, and dispersion $\sigma_H$ of the radius of gyration is 1.05 or more and 2 or less, wherein <H> is represented by <H>=$\Sigma H^2 n_H / \Sigma H n_H$) where $n_H$ denotes the number of projections having an arbitrary height, $\sigma_H$ is represented by $\sigma_H$=<H>/($\Sigma H n_H / \Sigma n_H$) where $n_H$ denotes the number of projections having an arbitrary height.

DESCRIPTION OF THE PREFERRED EMBODIMENTS

Figure 1:
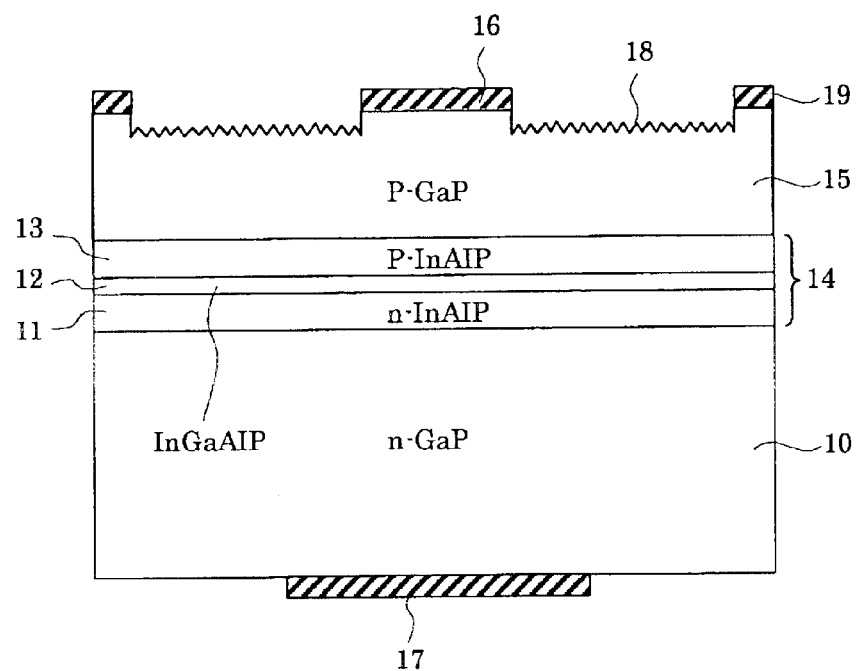
FIG. 1 is a cross section of a light-emitting device according to an embodiment of the invention.

The principle of the invention will be described hereinafter.

A surface structure of a light-emitting divece was investigated in order to enhance light emission efficiency of the light-emitting device in the invention, which was completed by finding that the following structure is optimum.

The invention provides a device having a finely roughened structure on a surface of an inorganic light permeable layer formed on a surface of the outermost layer at a light-emitting side or on the outer most layer of the light-emitting side of a semiconductor layer constituting the light-emitting element. The surface has a surface property comprising the following two conditions.

Namely, the mean radius of gyration <R> of projections in the roughened surface structure ($<R>=\Sigma R^2 n_R/\Sigma R n_R$) where $n_R$ is defined by the number of projections having an arbitrary radius of gyration) is 1/20 or more and 1/2 or less of the light wavelength, and dispersion $\sigma_R$ of the radius of gyration ($\sigma_R=<R>/(\Sigma R n_R/\Sigma n_R)$ where $n_R$ is defined by the number of projections having an arbitrary radius of gyration] is 1.05 or more and 2 or less.

The light available in the invention include a visible light as well as a UV light. Accordingly, the proper range of the light wavelength is in the range of 300 nm or more and 800 nm or less, and the mean radius of gyration is in the range of 15 nm or more and 400 nm or less.

The mean height <H> of projections in the roughened surface structure ($<H>=\Sigma H^2 n_H/\Sigma H n_H$) where $n_H$ is defined by the number of projections having an arbitrary height) is larger than 1/10 of the light wavelength and smaller than the light wavelength, and dispersion $\sigma_H$ of the height ($\sigma_H=<H>/(\Sigma H n_H/\Sigma n_H)$ where $n_H$ is defined by the number of projections having an arbitrary height] is 1.05 or more and 2 or less.

The surface having the finely roughened structure is used as the outermost surface layer at the light emitting side of the semiconductor layer constituting the light-emitting element. This is because the surface constituting the interface is required to have a finely roughened surface structure in order to efficiently emit a light from the light-emitting element, since the light transmission loss becomes large at the interface of plural substances, which constitute the light transmission passageway, having largely different refraction indices (for example, a difference of 1.5 times or more). The interface include an interface between the semiconductor layer constituting the light-emitting element and an air layer, or an interface between the semiconductor layer and the protective film when a protective film for protecting the light-emitting element such as a plastic layer is formed.

The invention is directed toward an improvement of light emission efficiency, and the size that the light reacts should be considered as a parameter for defining the surface structure. The object thereof is to conjecture the most appropriate expression of the light emission efficiency by defining the radius of gyration of the fine projections in the roughened surface structure that is considered to be optimum. That is, the radius of the fine projections of the surface structure of the invention is defined to be the radius of gyration. It is optically evident that different configurations of the surface structure exert the same function of the invention when the radius of gyration of each configuration is the same. The radius of gyration is defined in Dictionary of Science, fifth edition (Iwanami Shoten Publishers Co.).

The radius of gyration of the fine projections is defined as follows in the invention. The lowest point of a fine depression is surrounded by a circle having a center at the highest point of a fine projection on the roughened surface. Specifically, lines are drawn to each point on the depression with the center at the top of the projection on the roughened surface image obtained by an atomic force microscopic photograph. The image of this part is processed, and the center of gravity thereof is elucidated. The radius of gyration is obtained by a weighted mean distance from the center of gravity to each point of the depression, and is defined as R.

The radius of gyration may be determined by a light scattering method known in the art. That is, the scattered light intensity I(q) is measured as a function of a scattering vector q, and the radius of gyration can be determined from a slope of a plot of ln(q) vs. $q^2$ (see p73 of Polymer Alloy, ed. by Association of Polymer Science, published by Tokyo Kagaku Dojin Co., 1981).

Since the scattered image measures a correlation in a Fourier space, the radius of gyration can be also obtained by Fourier transform of an electron microscopic image (see Dictionary of Science, fifth edition, Iwanami Shoten Publishers Co.).

The scattering light is more largely influenced as the size of the roughened surface structure is larger, and the effect is proportional to the square of the size. Accordingly, the mean radius of gyration <R> is preferably 1/20 or larger of the wavelength of the emitted light from the light-emitting element. A mean radius of gyration <R> smaller than this range falls out of the range of Rayleigh scattering, and the effect of the roughened surface structure is rapidly lost. A more preferable range is about 1/10 or more of the light wavelength. A large mean radius of gyration <R>, or a mean radius of gyration <R> comparable to one half of the light wavelength, is not preferable, since the light recognizes the shape of the roughened surface structure itself to fail in manifesting the effect of the gradient of the refractive index. In addition, the mean radius of gyration <R> is desirably about 1/4 or less of the light wavelength that does not recognize the shape of the roughened surface structure at all.

The surface of the light-emitting device of the invention may have various sizes of the roughened surface structure. In other words, it is preferable that the size of the roughened surface structure of the light-emitting device of the invention is not completely uniform by the following reason.

It is well known that the light is scattered with a specific scattering angle when the roughened surface structure falls within a specified range. The angle dependency of the scattered light intensity at this time is represented by the following Bessel function:

$$\Phi(u)=(3/u^3)[\sin(u)-u\cos(u)]$$

$$u=4\pi(R/\lambda)\sin\theta$$

where R is a radius of a scattering body, $\lambda$ is a wavelength and $\theta$ is a scattering angle.

Since the scattered light from an assembly is represented by a sum of each component of the scattered light from each element of the assembly, a scattered light having a specific scattering angle is observed from a structure having the elements with a uniform size. When the size of the elements in this assembly has a certain distribution, the scattering function is convoluted with the distribution function (see Convolution: Dictionary of Science, Iwanami Shoten Publishers Co.), and the light is not scattered at a specified angle. This means, from a different point of view, that the wavelength dependency of a light such as the scattered light on the interface is lost.

The condition for obtaining the surface structure manifesting the effect of the invention is that it depends on the dispersion defined by a function of $\sigma_R = <R>/(\Sigma Rn_R/\Sigma n_R)$, where $n_R$ represents the number of the projections with a dimension of R. The dispersion of 1.05 or more was found to be appropriate, since the trough of the scattered light intensity against the scattering angle disappears by convoluting the scattered light intensity with the Bessel function. However, when the dispersion exceeds 2, the roughened structure becomes random and the scattering preventive effect is remarkably decreased.

The same argument is valid with respect to the height of the projections. Since the size of the roughened surface structure of the invention is smaller than the light wavelength, the light senses the mean value of the size of the roughened surface structure instead of sensing respective sizes of the projections in the structure. Accordingly, the refractive index that is sensed by the light corresponds to a mean refractive index on the surface parallel to the light-emitting surface, when a light emitting layer having a higher refractive index and a medium having a lower refractive index exist together. It is desirable that the mean value of the refractive index is smoothly decreased from the light emitting layer until the light reaches the outside of the element. For obtaining such gradient of the refractive index, it is desirable that the top and bottom levels of the roughened surface structure, or the height of the projections, are distributed to a certain extent, rather than they are perfectly uniform. In the structure of the surface of the light-emitting element, it is necessary that the mean height $<H>$ of the projections in the roughened surface structure ($<H> = \Sigma H^2 n_H / \Sigma H n_H$) is larger than $\frac{1}{10}$ of the light wavelength and smaller than the light wavelength, and that the dispersion $\sigma_H$ of the height ($\sigma_H = <H>/(\Sigma H n_H / \Sigma n_H)$) is 1.05 or more and 2 or less. The shape of the roughened surface structure is desirably approximated by a circular cone for obtaining a gradient of the refractive index.

The mean height $<H>$ of projections is defined by a mean-square height for weighting since the response of the light is larger as the size of the surface roughness is larger.

The mean height $<H>$ of projections is desirably $\frac{1}{10}$ or more of the light wavelength. When the mean height $<H>$ of projections is smaller than $\frac{1}{10}$, the refractive index changes within a very short distance, and the effect of the gradient of the refractive index is lost by the same principle as described above with respect to the radius of gyration, so that the effect of the roughened surface structure is rapidly lost. Since the effect of the roughened surface structure is applied as a square of the size thereof, the mean height of projections is desirably about one half or more of the light wavelength in order to maintain the effect of the invention. When the mean height of projections is too large, on the other hand, the effect of the gradient of refractive index is also lost. Accordingly, the mean height of projections is desirably about 1.5 times or less of the light wavelength where the light does not recognize the shape of the roughened surface structure at all. However, since the shape of the roughened surface structure is not stabilized when a pattern with a high aspect ratio is formed by etching, the effect cannot be obtained unless the mean height of projections is less than the light wavelength.

However, it is quite difficult to artificially form such fine roughened surface structure with good economical performance, wherein the size of the roughened patterns should be less than the light wavelength, and the pattern should not be perfectly random, although it is irregular to a certain extent.

The present inventors have found, in view of the problems as described above, that the conditions above could be attained by taking advantage of a self-assembling force in the nature. The inventors have noticed that the block copolymers developed by the inventors are suitable for readily realizing such self-organization power of the nature, and have completed the method for manufacturing the light-emitting device according to the invention (see Japanese Patent Application Laid-open No. 2000-100419).

A large amount of investment for experimental equipment such as an exposure apparatus using an eximer laser and electron beam drawing apparatus is not needed by taking advantage of the self-organization pattern of the block copolymer, and the apparatus and process used for the conventional compound semiconductors are available, thereby making it easy to meet the requirement of novel research and development.

The embodiment of the present invention will be described hereinafter.

[Light Emitting Device]

The light-emitting device according to the invention is a semiconductor light-emitting device such as a light-emitting diode (LED) and a laser diode (LD).

An example of the light-emitting device is shown in FIG. 1.

In FIG. 1, the reference numeral 10 denote an n-type GaP substrate, and a hetero-structure 14 including an n-type InAlP cladding layer 11, an InGaP active layer 12 and a p-type InAlP cladding layer 13 is formed on the substrate 10, and a p-type GaP current diffusion layer 15 is formed thereon. A p-type layer side electrode (upper electrode) 16 is formed on a part of the current diffusion layer 15, and an n-side electrode (lower electrode) 17 is formed on the back face of the substrate 10. The emitted light from the active layer 12 is projected out of a surface of the current diffusion layer 15 having no electrode 16.

Although the basic construction of the element is substantially the same as the construction of the conventional element, a finely roughened structure 18 is formed on the exposed surface of the current diffusion layer 15 having no electrode 16. The surface having the roughened structure serves as the surface with the mean radius of gyration and mean height of projections as described previously. An inorganic light permeable layer (not shown) having a comparable refractive index to that of the current diffusion layer may be formed on the exposed surface of the current diffusion layer 15 having no electrode 16, and the finely roughened structure may be formed on the surface of the inorganic light permeable layer. It is recommended to directly form the finely roughened structure on the exposed surface of the current diffusion layer 15 having no electrode 16, considering simplicity of the process and light emission efficiency. The effect of the invention is valid even after the fine roughened structure is covered with a sealing resin by finally coating the entire element with an epoxy resin.

[Method for Manufacturing Light-Emitting Element]

A method for manufacturing a light-emitting device will be described below.

Figure 2A:
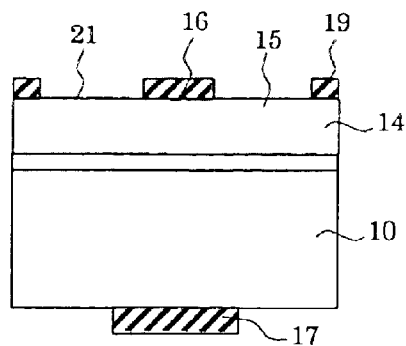
FIGS. 2A to 2E are schematic diagrams of the process for manufacturing the light-emitting device according to the embodiment of the invention.

As shown in FIG. 2A, the process for manufacturing the light-emitting device according to the invention is basically the same as the conventional process, wherein the hetero-structure 14 and current diffusion layer 15 are epitaxially grown on the n-GaP substrate 10, the p-type layer side electrode 16 was formed on the current diffusion layer 15, and the n-type electrode 17 is formed on the back face of the substrate 10.

Figure 2B:
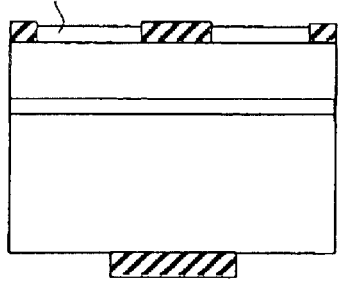

Then, a block copolymer as a composition for forming a microphase-separated structure as shown in FIG. 2B was dissolved into a solvent, and this solution was applied on the substrate shown in FIG. 2A by spin-coating, followed by forming a mask material layer 21 by evaporating the solvent by pre-baking. Thereafter, the substrate is annealed in a nitrogen atmosphere for phase separation of the block copolymer.

Figure 2C:
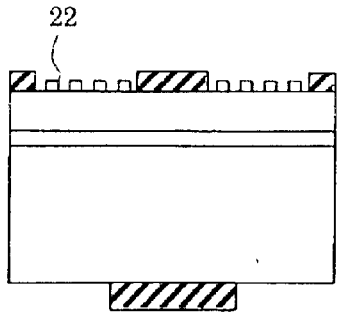

Subsequently, the substrate with the block copolymer after phase separation is etched by reactive ion etching (RIE) in an etching gas stream to etch the block copolymer in the layer after phase separation. Since any one of polymer fragment phases is selectively etched due to the difference of the etching rate among the plural polymer fragments constituting the block copolymer, a pattern 22 is left behind as shown in FIG. 2C.

Figure 2D:
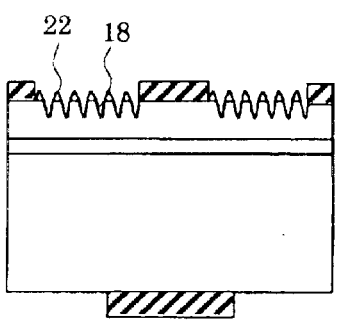
Figure 2E:
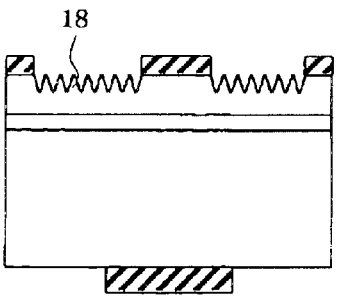

Then, the pattern 22 of the polymer fragment left behind without being etched is used as a mask as shown in FIG. 2D, and the substrate is etched by RIE using a prescribed etching gas, thereby forming a finely roughened pattern 18 on the surface of the current diffusion layer 15. $Cl_2$ gas as well as $BCl_3$, $N_2$ or Ar gas may be added to the etching gas used. Thereafter, the remaining polymer fragments are removed by $O_2$ ashing, and then the structure as shown in FIG. 1 (FIG. 2E).

[Resin Composition for Forming Microphase-Separated Structure]

As described above, in the invention, a micro-phase separation (an intramolecular phase separation of the block copolymer) is induced by forming a thin film of the block copolymer or graft copolymer, and one of the polymer phases is selectively removed to form a porous film having a nanometer size pattern. The porous film obtained can be used as a mask for transferring the pattern on the substrate by etching the substrate. For selectively removing one polymer phase from the microphase-separated structure of the invention, a difference of dry-etch rate, a difference of the degree of decomposition by an energy beam, or a difference of the degree of thermal decomposition between the two polymer phases is used. Any one of these methods can be used with high throughput and low cost, since no lithographic method is required.

The block copolymer or graft copolymer will be described at first. The block copolymer refers to as a linear copolymer in which a plurality of homopolymer chains is bonded by chemical bonds as blocks. Representative block copolymer available is an A-B type diblock copolymer having a -(AA··AA)-(BB··BB)-structure in which polymer chain A having repeating units A and polymer chain B having repeating units B are bonded at their terminals. A block copolymer in which three kinds or more of the polymer chains are bonded may be also used. The triple block copolymer may be any one of A-B-A type, B-A-B type and A-B-C type. A star-type block copolymer in which one or plural kinds of polymer chains are elongated from a center may be used. Also available is a $(A-B)_n$ type or $(A-B-A)_n$ type block copolymer having four or more blocks. The graft copolymer has a structure in which different polymer chains are dangling from a polymer main chain as side chains. Several kinds of polymers may be dangled as the side chains in the graft copolymer. A combination of a block copolymer and a graft copolymer is also available, wherein polymer chain C is dangling from a block copolymer such as A-B, A-B-A or B-A-B type block copolymer.

The block copolymer is preferable since polymers having a narrow molecular weight distribution are readily obtained and the composition ratio thereof can be easily controlled as compared with the graft copolymer. While the descriptions to be presented hereinafter mainly concerns the block copolymer, the same descriptions with respect to the block copolymer may be also applied to the graft copolymer.

The block copolymer and graft copolymer can be synthesized by various polymerization methods. Living polymerization methods are most preferable. In the living anion polymerization method or living cation polymerization method, polymerization of one kind of monomers is initiated using a polymerization initiator that forms anions or cations, and the block copolymer is synthesized by sequentially adding other monomers. The monomers available include those having double bonds such as vinyl compounds and butadiene, cyclic ether monomer such as ethylene oxide, and cyclic oligosiloxane monomers. Living radical polymerization may be also used. The molecular weight and copolymerization ratio can be precisely controlled in the living polymerization method, and block copolymers having a narrow molecular weight distribution may be synthesized. It is preferable for using the living polymerization method to thoroughly dry solvents with drying agent such as metallic sodium, and to prevent oxygen from mingling by freeze drying and bubbling of an inert gas. The monomers are polymerized in a stream of an inert gas preferably under a pressurized condition such as 2 atm or more. The pressurized condition allows moisture and oxygen to be effectively prevented from mingling from the outside of the reaction vessel while rendering the process relatively low cost.

A covalent bond, particularly a carbon-carbon bond or silicon-silicon bond, is preferable as the chemical bond for bonding the polymer chains.

Since special apparatus and skill are needed in the methods of synthesizing the block copolymer and graft copolymer as compared with the radical polymerization method, it is mainly used in the laboratory, and industrial applications thereof is quite limited from the view point of the cost. However, a sufficient cost efficiency may be attained by using the block copolymer and graft copolymer in an industrial field such as an electronic industry manufacturing products with high added values.

According to Flory-Haggins theory, a positive free energy $\Delta G$ is generally required for phase separation of polymer A from polymer B. Phase separation is liable to occur when polymer A and polymer B are incompatible, and the repulsion force between the two polymers is strong. Its molecular weight has some lower limit since micro-phase separation is liable to occur as the molecular weight of the block copolymer is larger. However, the polymers constituting the phases forming a phase-separated structure is not always required to be incompatible. The microphase-separated structure may be formed when precursor polymers of these polymers are incompatible. The polymer may be converted into a desired polymer by a reaction by heating, light irradiation or addition of a catalyst after forming a phase-separated structure using the precursor polymers. The phase-separated structure formed by the precursor polymer is not broken by appropriately selecting the reaction conditions.

Phase separation is most liable to occur when the composition ratio of the polymer A and polymer B is 50:50. This means that the microphase-separated structure that is most readily formed is a lamellar structure. In contrast, it may be sometimes difficult to form a sphere structure containing sphere comprising one polymer when the composition ratio of the other polymer is very high. Accordingly, the molecular weight of the block copolymer is very important for obtaining the desired microphase-separated structure.

A block copolymer having a larger molecular weight than the conventional block copolymer is used in the invention in order to pattern a structure with a nanometer size. The molecular weight required for the patterning is 100,000 or more and 10,000,000 or less. This means that the present invention provides a method for manufacturing a block copolymer or graft copolymer having a number average molecular weight of 100,000 or more and 10,000,000 or less according to the third aspect of the invention.

The size of the microphase-separated structure needed in the invention cannot be obtained when the molecular weight is less than 100,000. When the molecular weight is larger than 10,000,000, on the other hand, the viscosity becomes so high that it is impossible to form a self-organization structure, thereby failing in obtaining a desired pattern.

After obtaining the self-organization pattern, the substrate is processed by etching in the invention. Since a pattern having a larger size in the horizontal direction of the substrate than in the vertical direction is difficult to obtain in the spontaneously organized pattern, the thickness of the polymer film is reduced when the molecular weight as well as the self-organization structure is small. Accordingly, a thin etching mask should be used when the spontaneously organized pattern is small, thereby making the etching process difficult. Therefore, a molecular weight of larger than 400,000 makes the etching process easy. Since the polymer of the invention is usually synthesized by a living anion polymerization, water and oxygen should be strictly avoided. However, it is very difficult to perfectly remove a small amount of water and oxygen contained in the monomer. Accordingly, it is quite difficult to polymerize a polymer with a molecular weight of 3,000,000. The concentration of the polymer cannot be sufficiently increased when the molecular weight exceeds 3,000,000 because the viscosity becomes very high, thereby exhibiting irregular coating after application and drying.

However, it is very difficult to polymerize the block copolymer with a strictly controlled molecular weight. Accordingly, another homopolymer may be blended to control the composition ratio such that a desired composition ratio is obtained after measuring the molecular weight of the block copolymer synthesized. The amount of the homopolymer added is preferably adjusted to 100 parts by weight or less, preferably 50 parts by weight or less, and more preferably 10 parts by weight or less, relative to 100 parts by weight of the block copolymer. The microphase-separated structure may be disturbed when the amount of the homopolymer added is too large.

The A-B block copolymer phase may be separated from the homopolymer A phase when the solubility difference between the two polymers constituting the block copolymer is too large. For avoiding phase separation of the polymers as much as possible, it is preferable to reduce the molecular weight of homopolymer A. This is because blending homopolymer A having a small molecular weight shifts the entropy term in the Flory-Haggins equation in the negative direction, and the A-B block copolymer is readily mixed with homopolymer A. It is thermodynamically stable that the molecular weight of homopolymer A is smaller than the molecular weight of block A in the block copolymer. The molecular weight of homopolymer A is more preferably smaller than $2/3$ of the molecular weight of polymer A constituting the A-B block copolymer from the view point of thermodynamic stability. It is not preferable, on the other hand, that the molecular weight of homopolymer A is smaller than 1,000, since the homopolymer may be dissolved in polymer B in the A-B block copolymer. The molecular weight of homopolymer A is more preferably 3,000 or more considering the glass transition temperature. The technology for adjusting the composition ratio of these block copolymers and the method for preventing phase separation will be described in detail hereinafter.

An example of the resin composition for forming the micro-phase structure to be used in the invention will be described hereinafter. The resin composition for forming the micro-phase structure comprising a block copolymer or graft copolymer containing two or more kinds of polymer chains having a large difference of the dry etching rate will be described at first. The resin composition for forming the micro-phase structure of the invention contains a block copolymer or graft copolymer comprising two polymer chains with $N/(N_c-N_o)$ values of respective monomer units of 1.4 or more, wherein N represents the total number of atoms in the monomer unit, $N_c$ represents the number of carbon atoms in the monomer unit, and $N_o$ represents the number of oxygen atoms in the monomer unit. The condition that the $N/(N_c-N_o)$ values of the two polymer chains is 1.4 or more means that selective etching ratio between the polymer chains constituting the microphase-separated structure is large. In other words, one polymer phase is selectively etched while leaving the other polymer phase behind by dry etching after micro-phase separation of the resin composition for forming the micro-phase structure satisfying the condition above.

The parameter of $N/(N_c-N_o)$ will be described in more detail. N represents the total number of atoms in a segment (corresponds to the monomer unit), $N_c$ represents the number of carbon atoms in the segment, and $N_o$ represents the number of oxygen atoms in the segment. This parameter is an index of dry etching resistance of a polymer. The larger the value is, the more the dry etching rate increases (or the more the dry etching resistivity decreases). Namely, the relation between the etching rate $V_{etch}$ and the parameter is as follows:

$$V_{etch} \propto N/(N_c-N_o)$$

This tendency is almost independent on the kind of the etching gas such as Ar, $O_2$, $CF_4$ and $H_2$ [J. Electrochem. Soc., 130, 143 (1983)]. The gases described in the reference above such as Ar, $O_2$, $CF_4$ and $H_2$, as well as $C_2F_6$, $CHF_3$, $CH_2F_2$, $CF_3Br$, $N_2$, $NF_3$, $Cl_2$, $CCl_4$, HBr and $SF_6$ may be used as the etching gas. The parameter is not related to etching of inorganic substances such as silicon, glass and metal.

A practically used parameter is calculated with reference to chemical formulae. The parameter is 16/(8−0), or 2, since the monomer unit of polystyrene (PS) is represented by $C_8H_8$. The parameter is 13/(5−0), or 2.6, since the monomer unit of polyisoprene (PI) is represented by $C_5H_8$. The parameter is 15/(5−2), or 5, since the monomer unit of polymethacrylic acid (PMMA) is represented by $C_5O_2H_8$. Accordingly, it may be speculated that PS has a higher etching resistance in the PS-PMMA block copolymer, and only PMMA is readily etched. For example, it is confirmed that PMMA has an etching rate of several times higher than PS, when the block copolymer is etched by reactive ion-etching (RIE) under a condition of a $CF_4$ flow speed of 30 sccm, a pressure of 1.33 Pa (0.01 Torr), an propagating wave energy of 150 W and a reflection wave energy of 30 W.

Accordingly, the composition for forming the nano-structure in the micro-phase structure contains the block copolymer or graft copolymer suitable for use in the invention. A resin composition for forming the microphase-separated structure having a N/(Nc−No) ratio between the monomer units constituting each polymer chain of 1.4 or more may be obtained (N represents the total number of atoms in the monomer unit, $N_c$ represents the number of carbon atoms in the monomer unit, and $N_o$ represents the number of oxygen atoms in the monomer unit) with respect to at least two polymer chains of a plurality of monomer chains constituting the block copolymer or graft copolymer. A porous structure maintaining the microphase-separated structure may be formed using the block copolymer or graft copolymer as described above, by selectively removing at least one phase in the microphase-separated structure formed in the molded body by dry etching or wet etching.

[Improved Resin Composition for Forming Microphase-Separated Structure]

According to the method for manufacturing the light-emitting device using the resin composition for forming the microphase-separated structure as described above, it is evident that an device being excellent in luminous efficiency can be manufactured as described in the examples hereinafter.

However, the molecular weight of the block copolymer used for the resin composition for forming the microphase-separated structure is so high that a long period of annealing time is required for forming the microphase-separated structure (intramolecular phase-separated structure) of the block copolymer. The micro-phase structure after annealing has not always a sufficiently ordered structure, requiring more improvement.

For solving these problems, the inventors have found, through various studies, that the annealing time is dramatically shortened by adding a low molecular weight homopolymer in the ultra-high molecular weight block copolymer. It was also confirmed that ordering of the structure after annealing is also improved.

The improved resin composition for forming the microphase-separated structure is obtained by adding the low molecular weight homopolymer added to the block copolymer or graft copolymer.

The low molecular weight homopolymer is desirably one kind of the homopolymer of plural monomers constituting the block copolymer or graft copolymer. The desirable molecular weight of the low molecular weight homopolymer is 1,000 or more and 30,000 or less. A desired phase separation pattern cannot be obtained due to phase separation ascribed to the difference of solubility between two kinds of the polymers, when the molecular weight of the low molecular weight homopolymer is smaller than 15,000. When the molecular weight of the low molecular weight homopolymer is larger than 30,000, on the other hand, the desired effect cannot be also expected due to macroscopic phase separation between the block copolymer and low molecular weight homopolymer.

Any one of a PS homopolymer and PMMA homopolymer, or a mixture thereof, may be used as the low molecular weight homopolymer when a PS-PMMA copolymer is used as the block copolymer or graft copolymer. Likewise, any one of a PS homopolymer and PI homopolymer, or a mixture thereof, may be used as the low molecular weight homopolymer when a PS-PI copolymer is used.

The improved resin composition for forming the microphase-separated structure will be described hereinafter.

Duration of the annealing time of the block copolymer is important in the graded index (GI) processing for obtaining an LED surface having an optimum range of mean radius of gyration and mean height of projections in the roughened surface structure using the block copolymer according to the invention. While dot patterns with a diameter of about one hundred nanometers are suitable for GI processing, a block copolymer having a quite high molecular weight should be used for that purpose.

For example, an ultra-high molecular weight block copolymer of polystyrene (PS) having a molecular weight of about 300,000, and polymethyl methacrylic acid (PMMA) having a molecular weight of about 800,000 were needed for forming roughened patterns comprising projections with a diameter of about 110 nm. The molecule having a total molecular weight of the polymer of exceeding 1,000,000 required a very long annealing time for self-organization. This is because polymer A and polymer B should be coagulated by themselves by the movement of the polymer main chain to form a domain structure, in order to generate the microphase-separated structure by self-organization. However, increasing the molecular weight of the polymer means that the molecular chain becomes long, that is, there is a strong probability that the polymer chains are tangled with each other. Physical verification of the effect of tangling is described in Scaling Concept in Polymer physics (Cornell University Press, 1979) by P. de Gennes (Japanese translation version, "Polymer physics" by P. de Gennes, Yoshioka Shoten). Basically, the number of tangling points rapidly increases by increasing the molecular weight, and the polymer chains are restrained with each other to make it difficult to move, and self-organization during annealing is remarkably retarded. This is a problem inherent to the ultra-high molecular weight polymers designed for improving luminous efficiency of compound semiconductors. It was considered that long time annealing is inevitable, since it is an essential problem of the molecules.

The inventors have thought that the viscosity might be decreased by reducing the number of the tangling points. However, reducing the molecular weight is impossible since the size of the phase-separated structure also becomes small.

Accordingly, a phase-separated structure formed by the A-B block copolymer is used in the invention, wherein one of the polymers has a spherical structure. The polymer B becomes a minor phase that forms a spherical domain, when polymer B is the shorter chain of the polymer A and polymer B in the A-B block copolymer. The size of the polymer B as the minor phase is important. Accordingly, the number of the tangling points is reduced by decreasing only the molecular weight of polymer A without changing the molecular weight of polymer B. While the shape of the structure formed by polymer B is changed by this method, the problem is solved by adding homopolymer A. As a result, a pattern with a diameter of 100 nm or more can be formed without synthesizing an ultra-high molecular weight block copolymer. However, since it is difficult to synthesize the high molecular weight polymer by the living polymerization method, homopolymer A may be added together with homopolymer B. The same shape of the pattern can be obtained when the ratio between the homopolymer A and homopolymer B is always kept constant in the A-B block copolymer. Since the ordered structure of the pattern becomes poor by adding homopolymer A as a minor phase, the amount of addition is preferably 10% by weight or less relative to the total weight of the polymer.

However, there arises an inherent technical problem by using the ultra-high molecular weight block copolymer. According to the Flory-Haggins theory, a repulsive force is relatively enhanced due to decreased entropy by forming a high molecular weight polymer. Accordingly, a repulsive force is generated between the A-B block copolymer and polymer A or polymer B, causing micro-phase separation with a size of several micrometer. Consequently, a structure resembling to a salami-sausage as seen in SBS rubber is formed, thereby making it impossible to form a desired phase-separated structure, or a microphase-separated structure with a mean diameter of about 100 nm.

It was revealed for solving this problem that the molecular weight of homopolymer A should be reduced to an extent that does not arise a repulsive force acting on the A-B block copolymer. Homopolymer A is only dissolved in phase A of the A-B block copolymer by using the countermeasure as described above, and a microphase-separated structure just like the one formed by the A-B block copolymer alone is observed.

Synthesis of block copolymers has became possible in recent years using a living radical polymerization method. While this polymerization method is easy as compared with the living anion polymerization method, it as a drawback that the molecular weight distribution becomes wide. However, unexpected results could be obtained with respect to the molecular weight distribution from our investigations of the polymer synthesized by the living radical polymerization.

Figure 10:
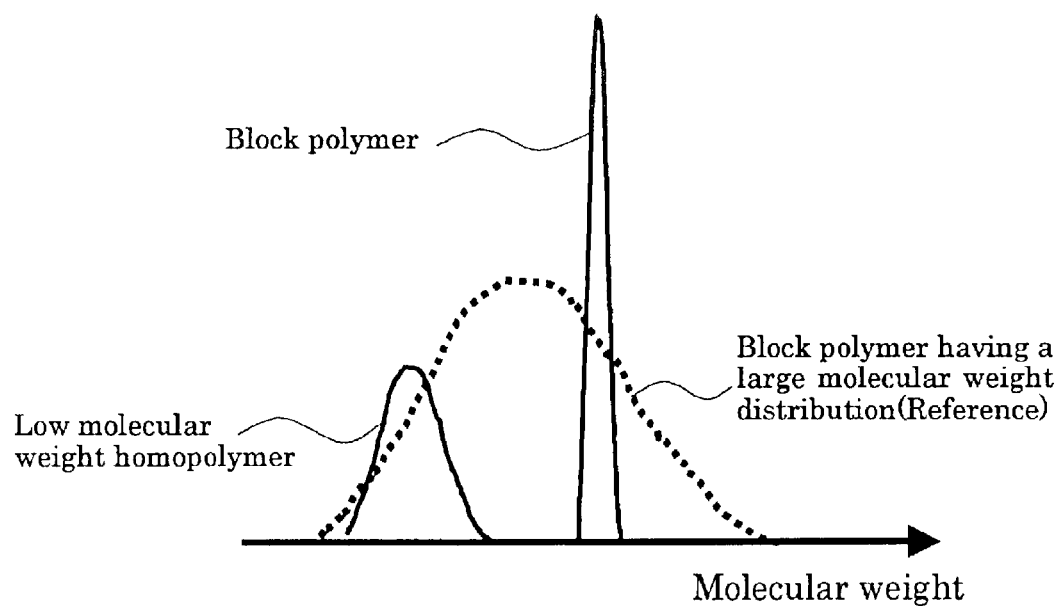
FIG. 10 is provided for describing the function of an embodiment of the invention.

A polymer having a narrow molecular weight distribution can be obtained by living anion polymerization. The polymer naturally has two molecular weight peaks as shown in FIG. 10, when a low molecular weight homopolymer is added to the block copolymer polymerized by this method. The ratio of Mw/Mn (weight average molecular weigh/number average molecular weight) as a standard of the molecular weight distribution increases when the molecular weight distribution is measured as if it is one kind of polymer. However, domains with substantially uniform sizes are formed by micro-phase separation between homopolymer A and homopolymer B when the molecular weights of the homopolymer are sufficiently low.

In contrast, the polymer prepared by the living radical method also has a wide molecular weight distribution as well as a large Mw/Mn ratio. It was found that various sizes of domains are formed with no circular patterns having a uniform diameter by an observation of the patterned thin film (see FIG. 7). This is conjectured to be a result of different molecular weight at different positions, because polymers with various molecular weights are mixed together with uneven mixing, arising a large distribution of the size of domains generated.

It was revealed that a large difference is observed between the composition of the block copolymer prepared by the radical polymerization method and the composition according to the invention, even when the polymer has a large Mw/Mn ratio.

The results above show that the effect of the invention is only manifested under the conditions below, wherein a sufficient amount of homopolymer A or homopolymer B as a major phase is mixed with the ultra-high molecular weight A-B block copolymer in which the molecular weight of homopolymer A is larger than the molecular weight of homopolymer B.

The mean molecular weight of the A-B block copolymer is very large, actually 300,000 or more, while the molecular weight distribution Mw/Mn is quite narrow, actually 1.2 or less. It is required that the molecular weight of the homopolymer added therein is $1/10$ or less of the molecular weight of the A-B block copolymer. The homopolymer is not required to have a narrow molecular weight distribution as obtained by living anion polymerization, and the homopolymer may be synthesized by radical polymerization.

The inventors have found the following facts through additional studies.

Generally speaking, a highly ordered polymer should be formed for obtaining the polymer containing no defects. A polymer having a uniform molecular weight with a Mw/Mn ratio of almost 1 was synthesized in the invention in order to obtain a pattern of a block copolymer having as high a regularity as possible. Using a block copolymer having a narrow molecular weight distribution enables a highly regulated pattern to be obtained, as has been proved in the block copolymer for hard disks recently disclosed in Japanese Patent Application Laid-open No. 2001-151834 by the inventors.

However, the ultra-high molecular weight polymer involves so many tangling points that it is impossible to obtain a perfectly ordered structure within a finite period of time. Accordingly, homopolymers with low molecular weights were added in order to more rapidly form the ordered structure, and it was shown that regularity of the polymer is improved by a practically available annealing time of, for example, about 10 hours. Therefore, the invention is useful for enhancing regularity of the phase-separated structure formed by the ultra-high molecular weight block copolymer with a molecular weight of 300,000 or more.

[Manufacture of Resin Composition for Forming Microphase-Separated Structure]

It is preferable to apply a uniform solution of the resin composition on the surface of the light-emitting element, in order to form a thin film comprising the resin composition for forming the microphase-separated structure of the invention. Using the uniform solution permits hysteresis to be prevented from remaining in the applied layer. It is not preferable that the coating solution becomes inhomogeneous by forming micelles having a relatively large particle diameter, since a regular pattern is hardly formed by mixing of irregular phase-separated structures, or a long period of time is needed for forming a ordered pattern.

The solvent for dissolving the block copolymer as the resin composition for forming the microphase-separated structure of the invention is desirably a good solvent against two kinds of the polymers constituting the block copolymer. The repulsive force among the polymer chains is proportional to the square of the solubility parameters between two kinds of the polymer chains. Using the good solvent for two kinds of the polymers reduces the solubility difference between two kinds of the polymers, which is advantageous for phase separation due to reduced free energy of the system.

For forming a thin film of the block copolymer, a solvent having a high boiling point of 150° C. or more, for example ethylcellosolve acetate (ECA), propyleneglycol monomethylether acetate (PGMEA) or ethyl lactate (EL), is preferably used such that a uniform solution can be prepared.

The thickness of the thin film of the composition for forming the microphase-separated structure is preferably two or three times of the radius of gyration of the projections of the desired roughened surface structure. The desired surface roughened structure can be hardly obtained when the thickness is out of the range described above.

[Manufacture of Microphase-Separated Structure]

The microphase-separated structure of the block copolymer or graft copolymer can be manufactured by the following method. For example, the block copolymer or graft copolymer is dissolved in an appropriate solvent to prepare an coating solution, and a film is formed by coating this coating solution on a substrate. A good phase-separated structure can be formed by annealing the film at a temperature of the glass transition temperature or more. The microphase-separated structure may be fixed at room temperature by melting the copolymer followed by forming the microphase-separated structure by annealing at a temperature of the glass transition temperature or more and the phase transition temperature or less. The microphase-separated structure can be also formed by slowly casting copolymer solution. It is also possible to form the microphase-separated structure by annealing after forming the molten copolymer into a desired shape by a hot-press method, injection molding method or transfer molding method.

The method for forming a nanometer size structure by taking advantage of the microphase-separated structure formed as described above is described in detail in Japanese Patent Application Laid-open No. 2000-100419 filed by the inventors, and the method is also employed in the invention.

A pattern transfer method is also effective in the invention. Details thereof are described in Japanese Patent Application Laid-open No. 2000-100419 filed by the inventors, and the method is also employed in the invention.

Specifically, a layer with a different etching resistivity (pattern transfer layer) is coated on the substrate of the compound semiconductor, and the block copolymer is coated thereon. A SOG (spin-on-glass) as well as materials disclosed in Japanese Patent Application Laid-open No. 2000-100419 may be used as the pattern transfer layer. The block copolymer film is subjected to dry or wet etching to selectively remove only one phase of the block copolymer, thereby forming a roughened pattern. Subsequently, the pattern transfer layer is etched using the organic polymer pattern as a mask. For example, the pattern transfer layer such as SOG can be etched with a fluorine, chlorine or bromine based gas using an organic mask.

As a result, the micro-phase separation pattern of the block copolymer can be transferred onto the pattern transfer layer. The substrate is then etched using the pattern transfer layer on which the pattern has been transferred as a mask. These methods are effective for etching a compound containing metals that is impossible to selectively etch carbon based materials. It is also possible to obtain a pattern with a high aspect ratio by laminating materials having different etching resistivity using the plural pattern transfer layers.

EXAMPLES (Reference Example)

The following reference experiments are presented for verifying the relation between the features of the roughened structure on the light-emitting surface of the invention and the luminance effect.

Various patterns were formed on the light-emitting surface for elucidating the effect of the shape of the pattern. Since it is difficult to synthesize a block copolymer corresponding to each pattern, it was drawn by an electron beam in place of forming by a chemical synthesis. Using an electron beam resist (FEP-301 made by Fuji Film Co.) as a model pattern in the experiment, a nanometer size pattern was formed using an electron beam exposure apparatus operated at an acceleration voltage of 50 kV and equipped with a pattern generator. Arbitrary patterns having desired size and distribution can be obtained using the exposure apparatus. Since polyhydroxystyrene having a similar dry etching resistance to polystyrene was used as a base polymer of the electron beam resist, almost the same etching pattern as the pattern formed by using a block copolymer can be obtained. The etching conditions of the substrate were the same as those in Example 3. The light wavelength of the element was 650 nm.

The effects of different patterns on luminance were measured. The luminance obtained from the surface of the light emitting layer having no roughened patterns at all is defined as a reference value 1 (a unit value), and the measured values are expressed as relative values. The size of the pattern is expressed by twice of the mean radius of gyration <R>, or by mean diameter 2<R>. The results are shown in Table 1.

TABLE 1

| Sample | 2<R> nm | $\sigma_R$ | <H> nm | $\sigma_H$ | Luminance effect |
|---|---|---|---|---|---|
| 1 | 30 | 1.1 | 180 | 1.2 | 1 |
| 2 | 50 | 1.1 | 180 | 1.2 | 1.2 |
| 3 | 80 | 1.1 | 180 | 1.2 | 1.3 |
| 4 | 110 | 1.1 | 180 | 1.2 | 1.5 |
| 5 | 150 | 1.1 | 180 | 1.2 | 1.7 |
| 6 | 200 | 1.1 | 180 | 1.2 | 1.7 |
| 7 | 250 | 1.1 | 180 | 1.2 | 1.6 |
| 8 | 300 | 1.1 | 180 | 1.2 | 1.5 |
| 9 | 350 | 1.1 | 180 | 1.2 | 1.4 |
| 10 | 400 | 1.1 | 180 | 1.2 | 1.2 |
| 11 | 500 | 1.1 | 180 | 1.2 | 1.1 |
| 12 | 600 | 1.1 | 180 | 1.2 | 0.9 |
| 13 | 800 | 1.1 | 180 | 1.2 | 0.5 |

The results in Table 1 clearly show that the effect on luminance increases with the increase of 2<R>. This is because interference of light increases with the size of the pattern. However, the proportion of scattered light increases as the size of the pattern further increases from the order of wavelength. The proportion of the light vertically emitted from the surface of the element reduces to result in further decrease of luminance.

The results above indicates that the preferable mean radius of gyration <R> in the invention at the wavelength of 650 nm is 25 nm or more and 250 nm or less (50 nm or more and 500 nm or less in the diameter).

The effect of different size of patterns on luminance was then measured. Patterns with sizes of 110 nm and 200 nm were used. For evaluating the effect on luminance, the luminance level of a sample having no distribution of the roughened pattern on the surface of the light emitting layer was defined as a reference value 1 (a unit value), and the measured values were expressed as relative values. The results are shown in Table 2.

TABLE 2

| Sample | 2<R> nm | $\sigma_R$ | <H> nm | $\sigma_H$ | Luminance effect |
|---|---|---|---|---|---|
| 14 | 110 | 1.0 | 180 | 1.2 | 1 |
| 15 | 110 | 1.1 | 180 | 1.2 | 1.3 |
| 16 | 110 | 1.2 | 180 | 1.2 | 1.4 |
| 17 | 110 | 1.4 | 180 | 1.2 | 1.2 |
| 18 | 110 | 1.7 | 180 | 1.2 | 1.1 |
| 19 | 110 | 2.0 | 180 | 1.2 | 1.0 |
| 20 | 110 | 3.0 | 180 | 1.2 | 0.6 |
| 21 | 200 | 1.0 | 350 | 1.2 | 1 |
| 22 | 200 | 1.1 | 350 | 1.2 | 1.2 |
| 23 | 200 | 1.2 | 350 | 1.2 | 1.3 |
| 24 | 200 | 1.4 | 350 | 1.2 | 1.2 |
| 25 | 200 | 1.7 | 350 | 1.2 | 1.1 |
| 26 | 200 | 2.0 | 350 | 1.2 | 1.0 |
| 27 | 200 | 3.0 | 350 | 1.2 | 0.5 |

The results in Table 2 show that the effect of luminance increases with the increased distribution of the pattern even when the size of the patterns are the same. However, too large distribution of the pattern results in decrease of luminance.

Subsequently, the effect of different heights of projections of the pattern on luminance was measured. The luminance level of a sample having no distribution of the roughened pattern on the surface of the light emitting layer was defined as a reference value 1 (a unit value), and the measured values were expressed as relative values. The results are shown in Table 3.

TABLE 3

| Sample | 2<R> nm | $\sigma_R$ | <H> nm | $\sigma_H$ | Luminance effect |
|---|---|---|---|---|---|
| 28 | 200 | 1.1 | 30 | 1.2 | 1 |
| 29 | 200 | 1.1 | 50 | 1.2 | 1.2 |
| 30 | 200 | 1.1 | 80 | 1.2 | 1.3 |
| 31 | 200 | 1.1 | 120 | 1.2 | 1.5 |
| 32 | 200 | 1.1 | 180 | 1.2 | 1.7 |
| 33 | 200 | 1.1 | 250 | 1.2 | 2.0 |
| 34 | 200 | 1.1 | 300 | 1.2 | 2.5 |
| 35 | 200 | 1.1 | 350 | 1.2 | 2.4 |
| 36 | 200 | 1.1 | 400 | 1.2 | 2.0 |
| 37 | 200 | 1.1 | 500 | 1.2 | 1.6 |
| 38 | 200 | 1.1 | 600 | 1.2 | 1.2 |
| 39 | 200 | 1.1 | 800 | 1.2 | 0.9 |
| 40 | 200 | 1.1 | 1000 | 1.2 | 0.5 |

The results in Table 3 show that the effect on luminance increases with the increase of <H>. This is because an increase of <H> gives a gradient in the refractive index. However, it was observed that the surface of the light emitting layer becomes turbid to enhance scattering of the light. In particular, it was observed that the intensity of light vertically emitted from the surface of the element is remarkably decreased. However, the luminous energy in the direction except the vertical direction is increased, and the luminous energy at the light emitting angle of 40 to 70° exceeded far above the unit level when the mean height <H> of projections of the surface pattern was increased to about 1.5 times of the wavelength. Accordingly, it was revealed that the mean height <H> of projections of about 1.5 times of the wavelength is effective for increasing the luminous energy when the structure of the element comprises a mirror or the like for reflecting the light.

The effect of different distribution of the height of the pattern on luminance was then measured. Luminance from a sample having no distribution in the height of the roughened pattern on the surface of the light emitting layer was defines as a reference value 1 (a unit value), and the measured value was expressed as a relative value. The results are shown in Table 4.

TABLE 4

| Sample | 2<R> nm | $\sigma_R$ | <H> nm | $\sigma_H$ | Luminance effect |
|---|---|---|---|---|---|
| 41 | 110 | 1.1 | 180 | 1.0 | 1 |
| 42 | 110 | 1.1 | 180 | 1.1 | 1.3 |
| 43 | 110 | 1.1 | 180 | 1.2 | 1.5 |
| 44 | 110 | 1.1 | 180 | 1.4 | 1.3 |
| 45 | 110 | 1.1 | 180 | 1.8 | 1.2 |
| 46 | 110 | 1.1 | 180 | 2.0 | 1.0 |
| 47 | 110 | 1.1 | 180 | 2.4 | 0.6 |
| 48 | 200 | 1.1 | 350 | 1.0 | 1 |
| 49 | 200 | 1.1 | 350 | 1.1 | 1.2 |
| 50 | 200 | 1.1 | 350 | 1.2 | 1.5 |
| 51 | 200 | 1.1 | 350 | 1.4 | 1.3 |
| 52 | 200 | 1.1 | 350 | 1.8 | 1.1 |
| 53 | 200 | 1.1 | 350 | 2.0 | 0.8 |
| 54 | 200 | 1.1 | 350 | 2.4 | 0.4 |

The results in Table 4 show that the effect of luminance increases with the increase of distribution, even when the height of the pattern is the same. This is conjectured to be the result of gradient in the refractive index ascribed to the distribution of the height. However, the proportion of scattering rapidly increases to decrease the luminous energy when the distribution is too large.

Details of the examples of the invention will be described hereinafter. Twice of the radius of gyration is defined as the diameter of circle of curvature in the examples.

Example 1

Examples of the invention will be described with reference to the drawings. As shown in FIG. 2A, the a GaAs or GaP compound semiconductor substrate 10 comprises an electrode 17 on one surface (bottom surface), and a light emitting layer 14 and a current diffusion layer 15 are epitaxially grown on the other surface of the substrate with an electrode 16 and an electrode wiring pattern 19 on the current diffusion layer. A n-GaAs, n-GaP or p-GaP is used for the semiconductor substrate, and an n-InAlP or p-InAlP cladding layer, an InGaAlP active layer and a light emitting layer are formed as a hetero-multilayer structure on the substrate. A p-InAlP, p-GaP or n-InGaAlP current diffusion layer 15 is laminated on the light emitting layer.

After applying a solution prepared by dissolving a block copolymer in a solvent on the substrate of the light-emitting element by spin-coating at a rotation number of 2500 rpm, the solvent was evaporated by pre-baking at 110° C. for 90 seconds. The block copolymer comprises polystyrene (PS) and polymethyl methacrylate (PMMA). The molecular weight of PS was 154,800, the molecular weight of PMMA was 392,300, and Mw/Mn was 1.08. The PS phase of the block copolymer 8 was separated from the PMMA phase by annealing at 210° C. for 4 hours in a nitrogen atmosphere (FIG. 2B).

The PS phase and PMMA phase in the phase separation layer of the block copolymer on the substrate were etched by reactive ion etching (RIE) under the condition of a $CF_4$ flow rate of 30 sccm, an etching gas pressure of 33 Pa (10 mTorr) and an etching power of 100 W. The PMMA phase was selectively etched due to the difference of the etching rate between the PS and PMMA phases, leaving the PS pattern behind (FIG. 2C). A fine pattern of the current diffusion layer 15 was formed on the light-emitting surface of the substrate by RIE under the condition of a $Cl_2$ flow rate of 100 sccm, an etching gas pressure of 0.65 Pa (5 mTorr) and an etching power of 300 W for about 30 seconds using the PS phase as a mask. Etching is possible by adding not only the $Cl_2$ gas but also $BCl_3$ gas or Ar gas (FIG. 2D).

Thereafter, the remaining PS phase was removed by ashing with $O_2$. As a result, there was formed a fine roughened pattern with a mean diameter (2<R>) of projections of about 50 to 70 nm with $\sigma_R$ of 1.3, a repeating cycle of projections of 100 nm, and a mean height <H> of projections of about 60 to 150 nm with $\sigma_H$ of 1.7 on the surface of the substrate 4 of the compound semiconductor except the area of the electrode and wiring patterns (FIG. 2E). The substrate was processed into a light-emitting element, and the element was compared with a light emitting diode not subjected to surface processing, finding that luminance showed 21% of improvement as an average of 10 devices.

Example 2

A substrate with the block copolymer after phase separation by the same method as in Example 1 was etched by RIE under the condition of an $O_2$ flow speed of 30 sccm, an etching gas pressure of 13.3 Pa (100 mTorr) and an etching power of 100 w to etch the separated PS and PMMA phases. Although $O_2$ cannot etch the substrate like $CF_4$, the PMMA phase can be selectively etched clearly. The process as in Example 1 was applied thereafter, thereby obtaining the same pattern as in Example 1. The fine roughened pattern comprises a mean diameter 2<R> of projections of about 60 nm with $\sigma_R$ of 1.2, a repeating cycle of projections of about 100 nm, and a mean height <H> of projections of about 110 nm with $\sigma_H$ of 1.4. The substrate was processed into an element and was subjected to a surface treatment, and the element was compared with a light emitting diode with no surface processing, finding that luminance showed 21% of improvement as an average of 10 devices.

Example 3

A block copolymer comprising PS with a molecular weight of 315,000 and PMMA with a molecular weight of 785,000 was dissolved in a solvent. The solution was applied on the surface of the light emitting layer of the GaP substrate as the light emitting diode used in Example 1 by spin coating at a rotation number of 3000 rpm. The solvent in the applied layer was evaporated by pre-baking at 110° C. for 90 minutes, thereby obtaining a layer with a thickness of 150 nm. The layer was then annealed at 210° C. for 4 hours to separate the PS and PMMA phases with each other, thereby forming a dot pattern of PS with a diameter of each dot of about 110 nm. The GaP substrate with the block copolymer after phase separation was etched by RIE under the condition of an $O_2$ flow speed of 30 sccm, an etching gas pressure of 13.3 Pa (100 mTorr) and an etching power of 100 W to etch the separated PS and PMMA phases. Although the GaP substrate is not etched with $O_2$, the PMMA phase is selectively etched. Since the etching ratio between the PS phase and the PMMA phase is 1:4, the PMMA phase is selectively etched with the PS pattern left behind with a thickness of about 130 nm. The substrate was etched using an inductive coupled plasma (ICP) for 2 minutes under the condition of a $BCl_3$ flow speed and $Cl_2$ flow speed of 5 sccm and 20 sccm, respectively, an etching gas pressure of 0.266 Pa (2 mTorr), and the incidence power and bias power of 100 w, thereby forming a pattern with a width of 100 nm and a height of 300 nm. The remaining PS phase was removed thereafter by $O_2$ ashing. As a result, the pattern shown in the photograph in FIG. 4 was obtained on the surface of the GaP light emitting layer. The projection had a mean diameter 2<R> of 110 nm with $\sigma_R$ of 1.1, and a mean height <H> of 300 nm with $\sigma_H$ of 1.2. The substrate was processed into an element with surface treatment and was compared with a light emitting diode with no surface treatment, thereby finding that luminance showed 55% of improvement as an average of 10 devices.

Example 4

A substrate with a block copolymer after phase separation was manufactured by the same method as in Example 3, and the separated PS and PMMA phases were etched by RIE under the condition of $BCl_3$ and $Cl_2$ flow speeds of 5 sccm and 20 sccm, respectively, an etching gas pressure of 0.266 Pa (2 mTorr), and an incident power and bias power of 100 W. The PMMA phase was selectively etched since the etching rate ratio was 1:4, leaving the PS pattern behind. The same process as in Example 1 was applied thereafter. As a result, a pattern having a mean diameter 2<R> of projections of 110 nm with $\sigma_R$ of 1.1, and a mean height <H> of projections of 380 nm with $\sigma_H$ of 1.6 was obtained on the surface of the light emitting layer of the compound semiconductor. The PMMA phase was selectively removed by RIE using the $BCl_3$ and $Cl_2$ etching gases, and the roughened pattern was formed on the surface of the light emitting layer of the compound semiconductor. The substrate was processed into a light-emitting diode with surface treatment, and the light-emitting diode was compared with a light emitting diode with no surface treatment, finding that luminance showed 50% of improvement as an average of 10 devices.

Example 5

A substrate with a block copolymer after phase separation was manufactured by the same method as in Example 1, and an electron beam with an output energy of 2 MeV was irradiated on the entire surface of the copolymer film to cleave the main chain of PMMA. The surface was developed with a developer (a mixed solution of methylisobutyl ketone and isopropyl alcohol) and rinsed, and the PS pattern was left behind by dissolving only the PMMA layer. The substrate was etched thereafter with phosphoric acid at 60° C., obtaining a pattern having a mean diameter 2<R> of projections of 80 nm with $\sigma_R$ of 1.4, a mean peak-to-peak distance of 180 nm, and a mean height <H> of projections of 120 nm with $\sigma_H$ of 1.3. Improvement of luminance was about 10%. However, since a wet process can be applied to make nano-scale roughened pattern, it is quite advantageous for manufacturing the light-emitting device.

Example 6

Figure 4:
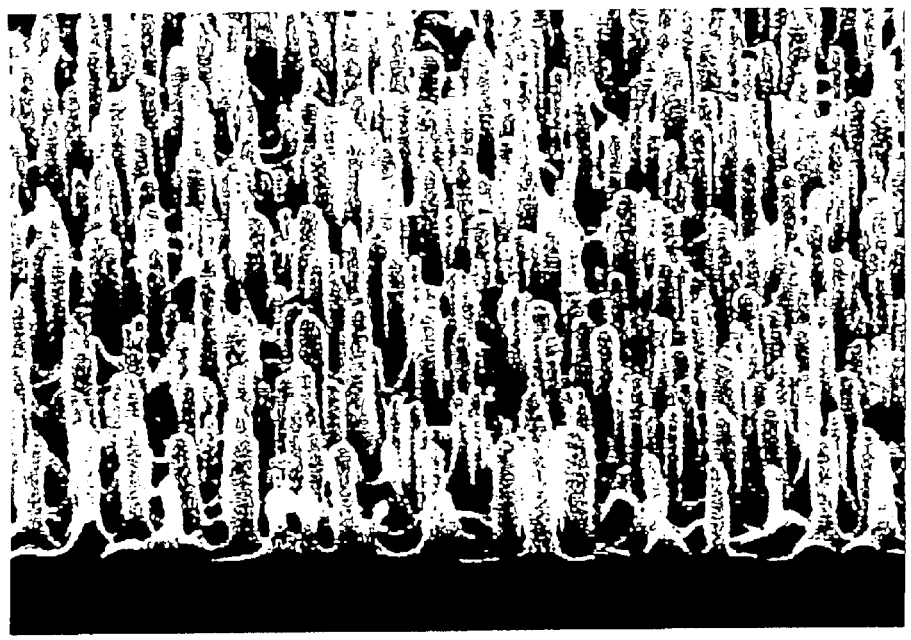
FIG. 4 shows a SEM image for observing the surface of the light-emitting device obtained in an embodiment of the invention.

A polystyrene (PS)-polyisoprene (PI) copolymer was used as the block copolymer. The molecular weight of PS was 450,000, the molecular weight of PI was 1,230,000, and Mw/Mn was 1.07. A substrate with the block copolymer after phase separation was manufactured by the same method as in Example 3. The PI phase in the PS-PI copolymer after phase separation was selectively removed by ozone oxidation. A pattern was formed using the remaining PS phase as a mask by etching with an induced coupled plasma (PSI) under the condition of $BCl_3$ and $Cl_2$ flow speeds of 5 sccm and 20 sccm, respectively, an etching gas pressure of 0.266 Pa (2 mTorr), and an incident power and bias power of 100 W. The remaining PS phase was removed by $O_2$ ashing thereafter. As a result, a pattern as shown in FIG. 4 was obtained on the surface of the GaP light emitting layer. The mean diameter 2<R> of projections was 140 nm with $\sigma_R$ of 1.1, and the mean height <H> of projections was 500 nm with $\sigma_H$ of 1.3. The substrate was processed into a light-emitting element with surface treatment, and the element was compared with a light emitting diode with no surface treatment, finding that luminance showed 75% of improvement as an average of 10 devices.

A high molecular weight PS-PI copolymer may be easily synthesized by this method as compared with the block copolymer comprising PMMA, since PI monomers is less hygroscopic. Accordingly, large roughened patterns are readily formed. The thickness of the layer is required to be approximately the same size as the size of the pattern formed by the block copolymer in the method of this example. Therefore, a large pattern enables the height of the pattern transferred on the compound semiconductor to be large. Almost the same structure was obtained by using polybutadiene (PB) in place of PI.

Example 7

Figure 3A:
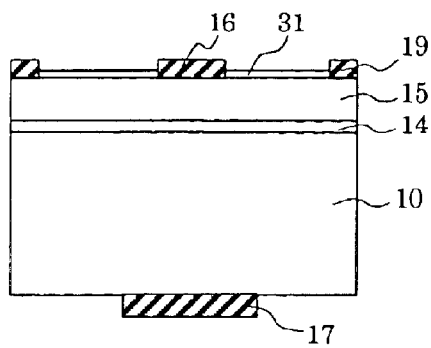
FIGS. 3A to 3E are another schematic diagrams of the process for manufacturing the light-emitting device according to another embodiment of the invention.
Figure 3B:
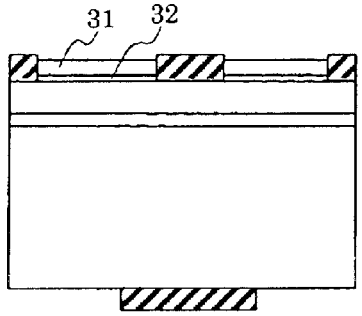

A three layer resist 31 (ARCXHRi C-11 made by Nissan Chemical Co.) was coated on a substrate of a light-emitting element on which the InGaAlP layer with the same structure as in Example 1 was deposited on the light-emitting surface thereof, and a layer with a thickness of 500 nm was formed. The substrate was baked at 300° C. for 1 minute in an oven. Subsequently, spin-on-glass (SOG) 32 (OCD T-7 made by Tokyo Oka Co.) was coated on the resist layer by spin-coating with a thickness of 110 nm, and the substrate was baked at 200° C. for 60 seconds on a hot-plate, followed by additional baking at 300° C. for 60 seconds. A solution prepared by dissolving the same block copolymer as in example 3 in a solvent was further applied by spin-coating on the substrate at a rotation number of 2500 rpm, followed by evaporating the solvent by pre-baking at 110° C. for 90 seconds. Subsequently, the substrate was annealed at 210° C. for 4 hours in a nitrogen atmosphere in order to separate the PS phase from the PMMA phase in the block copolymer 8 (FIG. 3B).

Figure 3C:
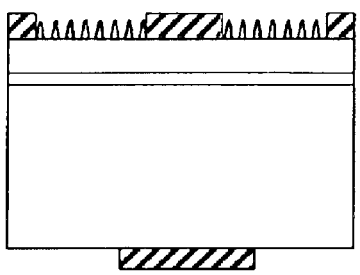

The substrate with the phase separated block copolymer was etched by RIE at an $O_2$ flow speed of 30 sccm and a gas pressure of 13.3 Pa (100 mTorr) with a power of 100 W, and the PS and PMMA phases after phase separation were etched (FIG. 3C). The PMMA phase was selectively etched due to the etching rate difference between the PS and PMMA phases, and the PS phase was left behind. Then, SOG was etched at a $CF_4$ flow speed of 30 sccm and gas pressure of 1.33 Pa (10 mTorr) with a power of 100 W using the PS phase as a mask. The lower resist layer was etched by RIE at an $O_2$ flow speed of 30 sccm and a gas pressure of 13.3 Pa (100 mTorr) with a power of 100 W, and thereby obtaining a columnar pattern with a height of 500 nm.

Figure 3D:
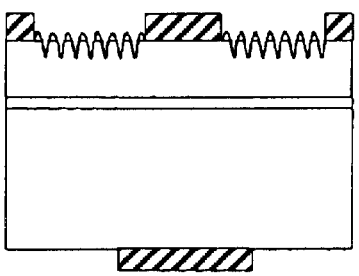
Figure 3E:
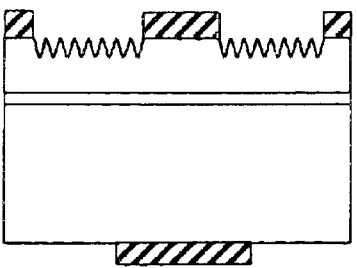

Subsequently, the remaining layer was etched under the condition of $BCl_3$ and $N_2$ flow speeds of 23 sccm and 7 sccm, respectively, and the gas pressure of 0.200 Pa (1.5 mTorr) with a power of 500 W (FIG. 3D). The remaining polymers were finally removed by ashing with oxygen (FIG. 3E). Etching of SOG was not attempted since it had been removed by preceding $BCl_3/N_2$ etching.

This pattern transfer method enabled etching of the InGaAlP layer that had been difficult by the normal etching methods using organic polymer as mask. The projections in the pattern after etching had a mean diameter 2<R> of 110 nm with $\sigma_R$ of 1.1 and a mean height <H> of 320 nm with $\sigma_H$ of 1.4.

Example 8

Spin-on-glass (SOG) 32 (OCD T-7 made by Tokyo Oka Co.) was coated on a substrate of a light-emitting element, on which InGaAlP layers with the same structure as in Example 1 were deposited on the surface of the light emitting layer by spin coating with a thickness of 110 nm, and the substrate was baked at 200° C. for 60 seconds with additional baking at 300° C. for 60 seconds. A solution prepared by dissolving the same block copolymer as in Example 3 in a solvent was applied on the substrate by spin-coating at a rotation number of 2500 rpm, and the solvent was evaporated by pre-baking at 110° C. for 90 seconds. Subsequently, the substrate was annealed at 210° C. for 4 hours to separate the PS and PMMA phases in the block copolymer 8 (FIG. 3B).

The PS and PMMA phases of the block copolymer after phase separation on the substrate were etched by RIE under the condition of an $O_2$ flow speed of 30 sccm, an $O_2$ gas pressure of 13.3 Pa (100 mTorr) and a power of 100 W (FIG. 3C). The PMMA phase was selectively etched due to the etching rate difference between the PS and PMMA phases, thereby leaving the PS pattern behind. SOG on the substrate was then etched under the condition of a $CF_4$ flow speed of 30 sccm, a $CF_4$ gas pressure of 1.33 Pa (10 mTorr) and a power of 100 W using the PS pattern as a mask.

Subsequently, the substrate was etched under the condition of $BCl_3$ and $N_2$ flow speeds of 23 sccm and 7 sccm, respectively, an etching gas pressure of 0.200 Pa (1.5 mTorr) and a power of 500 W (FIG. 3D). The polymer was finally removed by ashing with oxygen (FIG. 3E).

Figure 5:
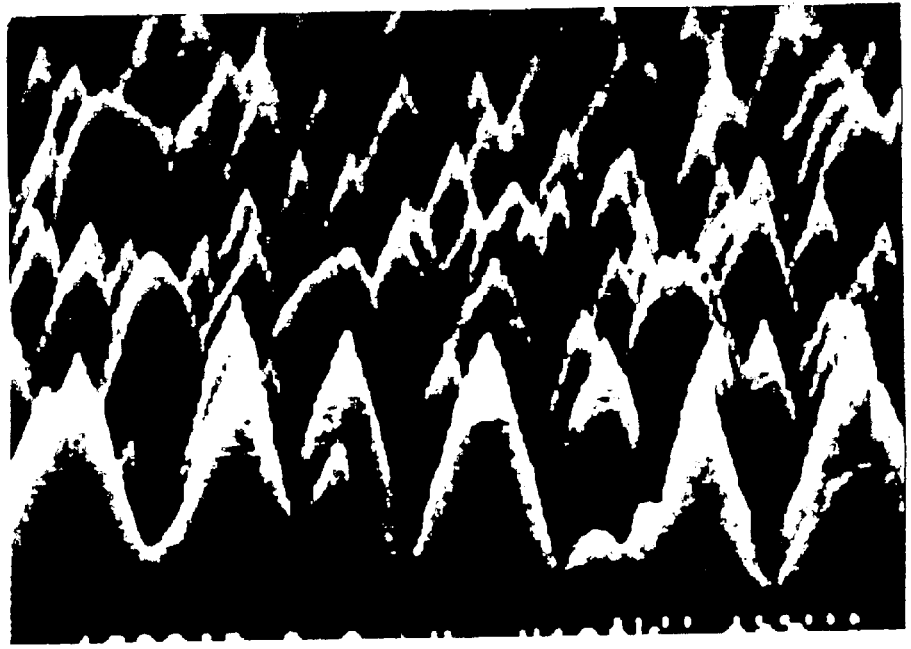
FIG. 5 shows a SEM image for observing the surface of the light-emitting device obtained in another embodiment of the invention.

A pattern of round conical projections as seen in the photograph in FIG. 5 with a mean diameter 2<R> of projections of 120 nm with $\sigma_R$ of 1.1, and a mean height <H> of 300 nm with $\sigma_H$ of 1.3 was obtained after etching. Such pattern is advantageous for obtaining a gradient of the refractive index on the surface.

The luminous efficiency of this sample was compared with the luminous efficiency of the sample with no pattern as described above, thereby confirming 80% of improvement in luminance of this sample.

Example 9

A diblock copolymer comprising polystyrene (PS) and polymethyl methacrylate (PMMA) was synthesized by living anion polymerization. PS was polymerized at −78° C. in an inert gas atmosphere using s-butyl lithium as an initiator, followed by polymerization of PMMA. The molecular weight of PS was 300,000 while the molecular weight of PMMA was 420,000. A small amount of the polymer was samples during polymerization, and the molecular weight was measured by gel permeation chromatography (GPC) using RI and UV detectors. While most of the final product was the PS-PMMA block copolymer, several percentage of PS homopolymer was observed from the UV profile of GPC. This is because active points are deactivated by adding MMA after completing polymerization of PS in the polymerization process, and thereby a PS homopolymer in the product remains (sample 1).

Sample 1 was dissolved in THF to form a 10% solution. n-Hexane was added to the solution until the weight ratio of THF to hexane becomes 1:1 to precipitate a part of the polymer. After stirring for about 1 hour, solid fractions were separated by filtration. As a result, a PS-PMMA diblock copolymer having a narrow molecular weight distribution was obtained (sample 2).

A PS-PMMA diblock copolymer having a different molecular weight was also synthesized by living anion polymerization. The molecular weight of PS was 315,000 while the molecular weight of PMMA was 785,000. Since this sample contained several percentages of the PS homopolymer as sample 1, it was purified by the same method as in sample 1, thereby obtaining a PMMA diblock copolymer having a narrow molecular weight distribution (sample 3).

A PS-PMMA diblock copolymer as a comparative sample was synthesized by living radical polymerization as a reference sample. Since PS is polymerized after polymerizing PMMA, a homopolymer of PMMA is mixed in the sample. Therefore, the PMMA homopolymer was removed by the same method as in sample 2 by taking advantage of the difference of the molecular weight due to the difference of solubility. The molecular weight of PS, the molecular weight of PMMA and Mw/Mn of this sample were 330,000, 750,000 and 2, respectively.

PMMA to be added was prepared by two polymerization methods of anion polymerization and radical polymerization.

Gallium phosphide (GaP) and gallium arsenide (GaAs) were used for the substrate of the light-emitting element. The block copolymers as samples 1 to 4 were dissolved in propyleneglycol monomethylether acetate (PGMEA) in a concentration of each polymer of 3% by weight. After applying each of these solutions on a substrate by spin coating at a rotation number of 2500 rpm, the solvent was evaporated by baking on a hot plate at 110° C. for 90 seconds. Then, the substrate was annealed in an oven at 210° C. for 40 hours in a nitrogen atmosphere to separate the PS and PMMA phases of the block copolymer in the film.

A periodic pattern of phase separation with a repeating cycle of about 1 to 10 μm was observed in sample 1 as observed by a phase mode of an atomic force microscope (AFM). Two different kinds of domains were observed in the phase separation pattern with a repeating cycle of about 1 to 10 μm, and a pattern with a size of 100 to 200 nm was observed in one domain. No nano-scale patterns were observed in the other domain. Two domains with the sizes of about 1 to 10 μm were formed mixed on the substrate.

It was found from more detailed observation of this structure that the pattern with the size of about 100 to 200 nm was ascribed to the domain formed by the PS and PMMA block copolymers, and the domain having no patterns was composed of the PS homopolymer.

This is conjectured to be the result of macro-phase separation of the PS-PMMA block copolymer and PS homopolymer with additional micro-phase separation in the PS-PMMA block copolymer.

Patterns with a size of about 100 to 200 nm comprising stripes and spheres were observed on the entire surface of sample 2. This is conjectured to be the result of removing the PS homopolymer by purification to leave only the block copolymer behind without arising macroscopic phase separation.

Figure 6:
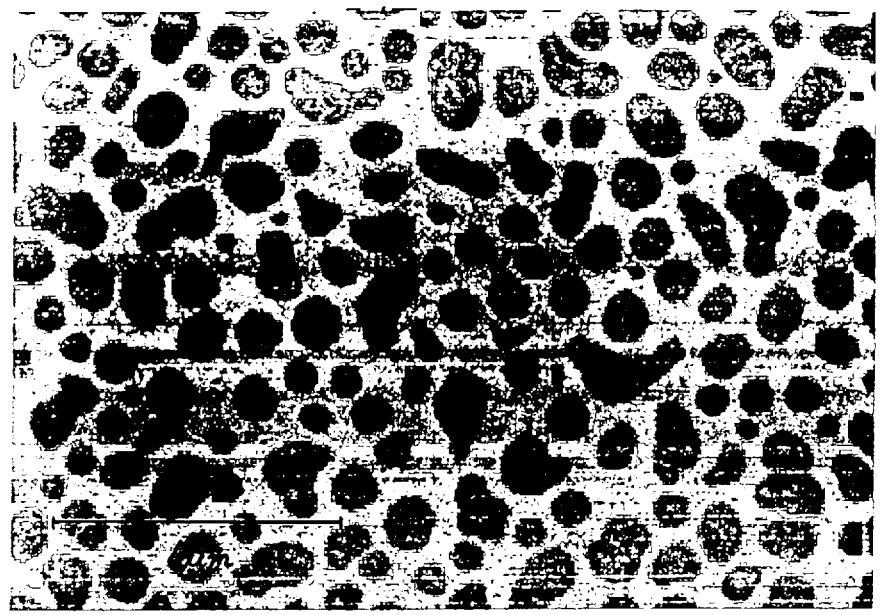
FIG. 6 is a phase image of AFM showing a microphase-separated structure obtained in a different embodiment of the present invention.

Spherical patterns with a size of about 100 to 200 nm were observed on the entire surface of sample 2 (FIG. 6).

Figure 7:
FIG. 7 is a phase image of AFM showing a microphase-separated structure obtained in a further different embodiment of the present invention.

Spherical patterns with different diameters were observed in sample 4 (FIG. 7). Since sample 4 has a wide distribution of the molecular weight, remarkable irregularity is conjectured to be generated in the microphase-separated structure to arise the microphase-separated structure comprising different sizes of patterns.

The same results were obtained in the GaAs substrate. While the shape of the domains seemed to be a little larger in the Si substrate, the results were resembled to the other substrates.

Example 10

Spherical patterns were formed by mixing a low molecular weight PMMA homopolymer in sample 2. The PMMA homopolymers used are listed in Table 5.

TABLE 5

| PMMA | Mw | Mw/Mn |
|---|---|---|
| 1 | 5000 | 1.6 |
| 2 | 10000 | 1.5 |
| 3 | 15000 | 1.4 |
| 4 | 25000 | 1.4 |
| 5 | 40000 | 1.4 |
| 6 | 80000 | 1.6 |
| 7 | 6000 | 1.1 |
| 8 | 12000 | 1.1 |
| 9 | 22000 | 1.1 |
| 10 | 30000 | 1.1 |
| 11 | 45000 | 1.1 |
| 12 | 75000 | 1.1 |

Sample 2 were mixed with the low molecular weight PMMA homopolymer in a weight ratio of 6:4, and a PGMEA solution was prepared so that the solution contains 3% by weight each of sample 2 and PMMA.

The solution was applied on a gallium phosphide (GaP) substrate by spin-coating at a rotation number of 2500 rpm, and the solvent was evaporated by pre-baking at 110° C. for 90 seconds. Then, the substrate was annealed at 210° C. for 40 hours in a nitrogen atmosphere, separating the PS and PMMA phases in the block copolymer. The polymer film was observed by the phase mode of AFM.

Patterns in which islets of PS with a diameter of about 110 nm are uniformly dispersed were obtained in PMMA 1 to 4 and PMMA 7 to 9.

Figure 8:
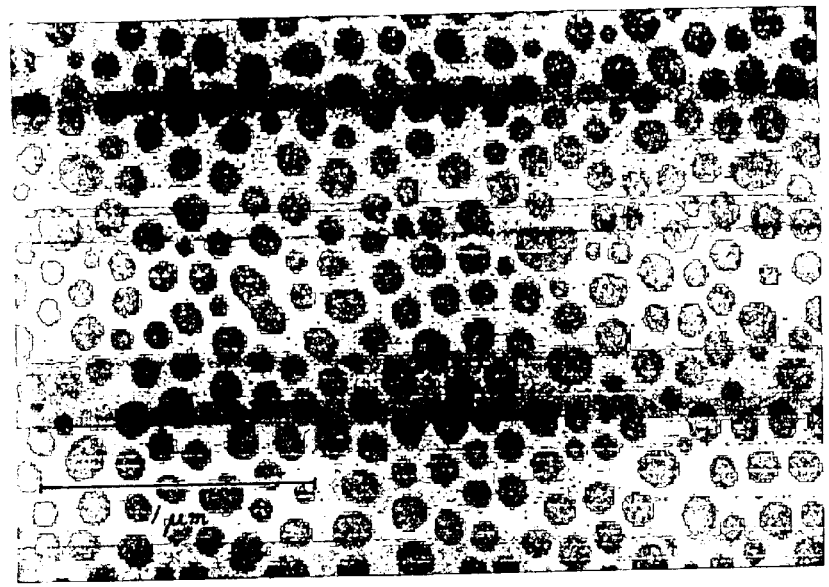
FIG. 8 is a phase image of AFM showing a microphase-separated structure obtained in a further different embodiment of the present invention.

In contrast, two kinds of different domains ascribed to micro-phase separation with a repeating cycle of about 110 nm were observed in PMMA 5, 6 and 12. A PS-PMMA patterns with the sizes of about 100 to 200 nm was observed in one domain, while no patterns were observed in the other domain, and the former one was revealed to be the PMMA domain from the phase image. FIG. 8 shows the phase images of mixture of sample 2 and PMMA 3.

Macroscopic phase separation was partly observed in the mixture of sample 2 and PMMA 9.

It was confirmed from these results that the PMMA homopolymer is not dissolved in the PMMA phase of the PS-PMMA block copolymer when the molecular weight of the homopolymer added is larger than 30,000, thereby arising phase separation.

Example 11

PMMA 1 to 4, and PMMA 7 to 9 by which patterns were formed in Example 10 were mixed with sample 2 in the same composition as in Example 10, and thin films were formed on the GaP substrate by the same process as in Example 10.

The solution was applied on the gallium arsenide (GaAs) substrate by spin-coating at a rotation number of 2500 rpm, and the solvent was evaporated by pre-baking at 110° C. for 90 seconds. The substrate was annealed at 210° C. for 1, 2, 4, 8, 16, 40 or 100 hours to separate the PS and PMMA phases in the block copolymer. The layers were observed by a phase mode of AFM. The sample in Example 10 was used for annealing for 40 hours.

The diameters of the phase separation patterns of the PMMA phase was measured, and σ-value was calculated from the mean diameter 2<R>. The results are summarized in Table 6.

TABLE 6

| Sample | 1 hr | 2 hr | 4 hr | 8 hr | 16 hr | 40 hr | 100 hr |
|---|---|---|---|---|---|---|---|
| 1 | 0.55 | 0.43 | 0.33 | 0.26 | 0.22 | 0.23 | 0.21 |
| 2 | 0.58 | 0.40 | 0.29 | 0.15 | 0.16 | 0.14 | 0.16 |
| 3 | 0.55 | 0.41 | 0.31 | 0.20 | 0.18 | 0.17 | 0.15 |
| 4 | 0.59 | 0.43 | 0.30 | 0.24 | 0.22 | 0.20 | 0.19 |
| 7 | 0.55 | 0.43 | 0.33 | 0.26 | 0.22 | 0.23 | 0.20 |
| 8 | 0.55 | 0.39 | 0.28 | 0.23 | 0.18 | 0.14 | 0.15 |
| 9 | 0.53 | 0.44 | 0.33 | 0.24 | 0.24 | 0.20 | 0.22 |

The results above showed that adding PMMA with a molecular weight of about 10,000 to 20,000 is effective for enhancing ordered arrangement of the phase separation patterns. Desired ordered patterns cannot be formed due to macro-phase separation between the block copolymer and homopolymer, when PMMA with a molecular weight of larger than 30,000 is used. No effect of the molecular weight distribution of the homopolymer added was observed.

Example 12

PMMA 3 and PMMA 8 by which the patterns in Example 10 were formed were mixed with sample 2 in the same composition as in example 10. A PGMEA solution with a concentration of 3% by weight was also prepared using sample 3 by which spherical patterns are formed only by the block copolymer.

The solution was applied on the gallium arsenide (GaAs) substrate by spin-coating at a rotation number of 2500 rpm, and the solvent was evaporated by pre-baking at 110° C. for 90 seconds. The substrate was annealed at 240° C. for 100 hours in a nitrogen atmosphere containing 3% of hydrogen to separate the PS and PMMA phases in the block copolymer. The substrate was also annealed at 210° C. for 8,100 hours. The layer formed was observed by the phase mode of AFM, and the σ-value was calculated from the mean diameters of the PMMA patterns after phase separation. The results are summarized in Table 7.

TABLE 7

| Sample | 210° C. for 8 hr | 210° C. for 100 hr | 240° C. for 8 hr | 240° C. for 100 hr |
|---|---|---|---|---|
| Sample 2 + PMMA 3 | 0.26 | 0.21 | 0.12 | 0.07 |
| Sample 2 + PMMA 8 | 0.23 | 0.15 | 0.14 | 0.09 |
| Sample 3 | 0.35 | 0.32 | 0.18 | 0.11 |

The results above showed that the sample prepared by adding the low molecular weight homopolymer in the block copolymer (Sample 2+PMMA 3, Sample 2+PMMA8) is more highly ordered than the block copolymer alone (Sample 3), provided that the sizes thereof are resembling. While the block copolymer that is able to form spherical domains by itself was considered to have a narrow molecular weight distribution and give a uniform pattern, it was actually found that a more regular structure is obtained by adding the low molecular weight homopolymer. Although the patterns are aligned by annealing for an infinite period of time, mobility of the polymer is more effective when the annealing time is limited. This means that the smaller the molecular weight is, the viscosity is more reduced to enable the structure to be formed within a short time.

Example 13

This example will be described with reference to FIG. 2. As shown in FIG. 2A, the substrate comprises a GaAs or GaP compound semiconductor layer 10 having the electrode 17 on one surface (the lower surface), and a semiconductor light-emitting element comprising the light emitting layer 14 and current diffusion layer 15 was epitaxially grown on the substrate with the electrode 16 and electrode wiring pattern 19 on the current diffusion layer. The compound semiconductor substrate is formed as a hetero-multilayer structure using n-GaAs, n-GaP or p-GaP with an n-InAlP or p-InAlP cladding layer, an InGaAlP active layer and a light emitting layer formed thereon, and the p-InAlP. P-GaP or n-InGaAlP current diffusion layer 15 is laminated on the light emitting layer.

Sample 2 and PMMA 3 homopolymer were mixed in a weight ratio of 6:4 as a phase separation polymer, and a PGMEA solution was prepared so that the solution contains 3% by weight each of sample 2 and PMMA homopolymer. Likewise, sample 2 and PMMA 8 were also mixed. Sample 3 was also mixed so that a 3% by weight of the PGMEA solution is obtained.

These solutions were applied on the light-emitting element substrate by spin-coating at a rotation number of 2500 rpm, and the solvent was evaporated by pre-baking at 110° C. for 90 seconds. The substrate was then annealed at 210° C. for 8 hours in a nitrogen atmosphere, and the PS and PMMA phases in the block copolymer 8 were separated.

The substrate with the block copolymer after phase separation was etched by RIE under the condition of a $CF_4$ flow rate of 30 sccm, a pressure of 1.33 Pa (10 mTorr) and a power of 100 W to etch the Ps and PMMA phases in the layer after phase separation. The PMMA phase is selectively etched due to the difference of the etching rate between the PS and PMMA phases, thereby leaving the PS pattern behind. The substrate was etched by RIE for about 30 seconds using the PS pattern as a mask under the condition of a $Cl_2$ flow speed of 100 sccm, a pressure of 0.65 Pa (5 mTorr) and a power of 300 W, forming fine patterns on the current diffusion layer 15. Etching is possible using not only the $Cl_2$ gas, but also using the $Cl_2$ gas in which a $BCl_3$ gas or an Ar gas is added. The remaining PS phase was removed thereafter by ashing with $O_2$.

A finely roughened surface with a mean diameter of projections of about 50 to 70 nm with $\sigma_R$ of 1.3, a repeating cycle of the patterns of about 100 nm and a mean height <H> of projections of about 60 to 150 nm with $\sigma_H$ of 1.7 was formed on the surface of the semiconductor substrate 4 except on the electrode and wiring patterns. The substrate was sealed with an epoxy resin, and was processed into a light emitting diode. Luminance of ten pieces of these elements was compared with luminance of light emitting diodes not subjected to surface treatment. The results are shown in Table. 8.

TABLE 8

| Sample | Luminance |
|---|---|
| Surface processed sample | 100 |
| Sample 2 + PMMA 3 | 136 |
| Sample 2 + PMMA 8 | 138 |
| Sample 3 | 124 |

These results show that luminance was improved due to a graded refractive index structure formed by the PS-PMMA patterns having a certain degree of regularity.

Example 14

In this example, polystyrene(PS)-polyisoprene(PI) block copolymer (molecular weight—PS: 230,000, PI: 400,000, Mw/Mn: 1.06) was used as the phase separation polymer, and PI (molecular weight: 2,000, Mw/Mn: 1.45) was used as the low molecular weight homopolymer.

The PS-PI diblock copolymer was synthesized by living anion polymerization by the same method as in Example 9 with addition of the low molecular weight homopolymer of PI synthesized by conventional radical polymerization, and the mixture was dissolved in PGEMEA to prepare a solution. A thin film of the mixture of the PS-PI diblock copolymer and PI homopolymer was formed on the compound semiconductor substrate as in Example 13, a microphase-separated structure was formed by annealing with heating, and the PI phase was removed by ozone oxidation, thereby forming a PS etching mask on the substrate. The substrate was processed into a light emitting element and sealed with an epoxy resin, then assembled as a light emitting diode, as the same way as example 13.

The results showed that an improvement of about 40% was observed as compared with the sample with no processing on the light-emitting surface.

Example 15

A diblock copolymer of polystyrene (PS) and polymethacrylic acid (PMMA) was synthesized by living anion polymerization as in Example 9. Unreacted components such as PS were removed in hot hexane. The molecular weight of PS was 240,000 and the molecular weight of PMMA was 730,000 with Mw/Mn of the total polymer of 1.08. A sample prepared by adding PMMA homopolymer with a molecular weight of 15,000 and PS homopolymer with a molecular weight of 9,000 in the block copolymer above was applied on the substrate to from a thin film. The mixing ratio of the PS-PMMA block copolymer, PMMA homopolymer and PS homopolymer, and the diameter of the micro-phase separation pattern of PS are as described in the following table.

TABLE 9

|  | PS-PMMA:PMMA:PS | Diameter of PS |
| --- | --- | --- |
| Example 1 | 8:2:0 | 100 nm |
| Example 2 | 8:4:0.5 | 150 nm |
| Example 3 | 8:6:1 | 180 nm |

The results in Table 9 show that the size of the spherical pattern of the PS phase increases by adding the PS homopolymer. The thickness of the layer is required to be approximately equal to the diameter of the spherical pattern of the PS phase in the invention. Accordingly, the thin film of the polymer was formed on the GaP substrate having an electrode formed thereon by adjusting the polymer concentration and rotation number of spin-coating so that the diameter of the pattern obtained becomes approximately equal to the thickness of the layer. A phase-separated structure was generated in the layer by annealing by the same method as described above.

The substrate with the block copolymer after phase separation was etched by RIE under the condition of a $O_2$ flow speed of 30 sccm, a pressure of 1.3 Pa (10 mTorr) and a power of 100 W, thereby removing the PMMA phase in the polymer film after phase separation. The substrate was then etched by RIE under the condition of a $Cl_2$ flow speed of 100 sccm, a pressure of 0.65 Pa (5 mTorr) and a power of 300 W, thereby forming a fine pattern on the current diffusion layer.

The remaining PS phase was removed by ashing with $O_2$, and a roughened pattern was formed on the surface of the semiconductor substrate except the area with the patterns of electrodes and wiring.

The improvement of luminance of the samples having roughened patterns was compared with luminance of the samples having no roughened patterns, and the results are shown in Table 10.

TABLE 10

|  | Diameter of projections | Height | Improvement of luminance |
| --- | --- | --- | --- |
| Example 1 | 100 nm | 300 nm | 25% |
| Example 2 | 150 nm | 450 nm | 50% |
| Example 3 | 180 nm | 540 nm | 80% |

As shown in Table 10, it is possible to increase the size of the phase separation pattern of the block copolymer by adding the homopolymer in the major phase as well as in the minor phase of the block copolymer. Consequently, the compound semiconductor may be etched deep into the semiconductor by increasing the height of projections in the PS phase as a mask for etching the compound semiconductor. As a result, the roughened pattern may become higher and luminance is more improved. This method is effective when the molecular weight can be hardly increased, or for ameliorating the effect of uneven distribution of the molecular weight among the production lots.

Example 16

A SiNx pattern as an etching mask is formed on a single crystal of $Al_2O_3$ as follows. A layer of SiNx with a thickness of 200 nm was deposited on the single crystal of $Al_2O_3$ by plasma CVD, and a solution prepared by dissolving a block copolymer of PS (molecular weight 315,00) and PMMA (molecular weight 785,000) in PGMEA was applied by spin-coating at 3000 rpm on the SiNx layer on the $Al_2O_3$ single crystal. A thin film was obtained by evaporating the solvent by pre-baking at 110° C. for 90 seconds. Then, the PS phase was separated from the PMMA phase by annealing at 180° C. for 4 hours in a nitrogen atmosphere, thereby forming a dot pattern of polystyrene with a diameter of about 110 nm. The substrate of the $Al_2O_3$ single crystal with the block copolymer after phase separation was etched by RIE under the condition of a $O_2$ flow speed of 30 sccm, a pressure of 13.3 Pa (100 mTorr) and a power of 100 W, and the PMMA phase of the PS-PMMA layer after phase separation was selectively etched. A pattern of coagulated polystyrene was left behind with a space of about 0.1 $\mu$m, and the pattern was used as a-mask for patterning SiNx.

The sample above was etched for 6.5 minutes under the condition of Ar and $CHF_3$ flow speeds of 185 sccm and 15 sccm, receptively, and a pressure of 40 mTorr, thereby forming a SiNx pattern as an etching mask. The $Al_2O_3$ single crystal was then etched for 20 minutes using the SiNx pattern as a mask under the condition of $BCl_3$ and Ar flow speeds of 80 sccm and 20 sccm, receptively, a pressure of 30 mTorr and a power of 100 W, and a finely roughened pattern with a mean diameter of 110 nm and a mean height <H> of 200 nm was formed on the surface of the $Al_2O_3$ single crystal.

Figure 9:
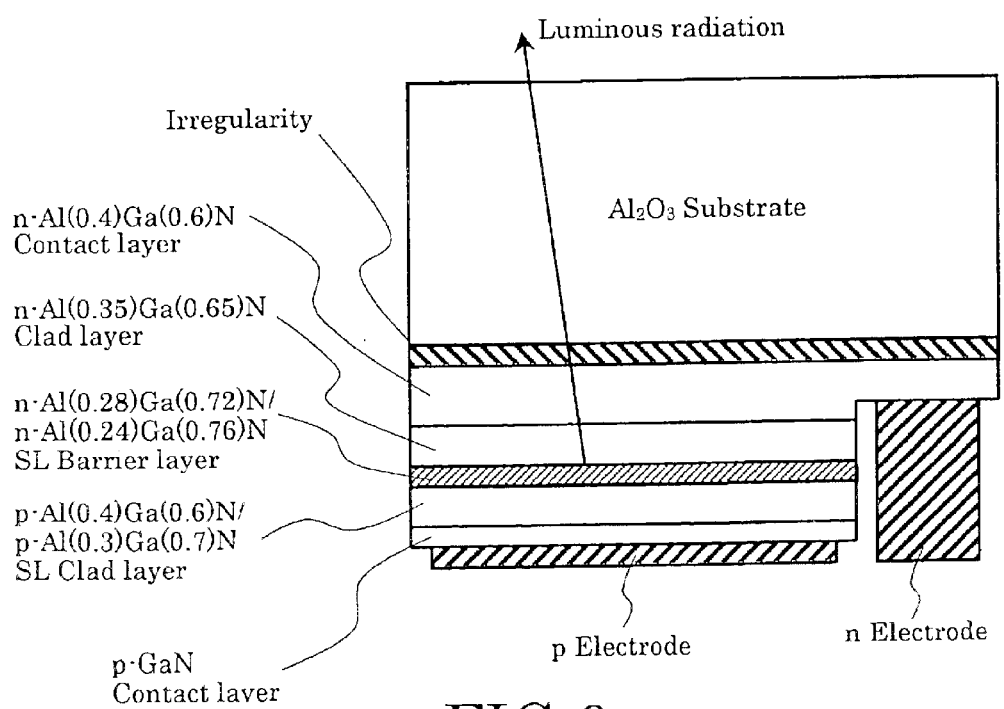
FIG. 9 is a cross section of a light-emitting device showing a further different embodiment of the present invention.

In the CVD process thereafter, n-Al (0.4), Ga (0.6), N (contact layer), n-Al (0.35), Ga (0.65), N (cladding layer), n-Al (0.28), Ga (0.72), N/n-Al (0.24), Ga (0.76), N (SL active layer), p-Al (0.4), Ga (0.6), N/p-Al (0.3), Ga (0.7), N (SL cladding layer) and p-GaN (contact layer) were sequentially laminated. The tip was cut after forming electrodes to manufacture a light-emitting element. The construction of the device is shown in FIG. 9.

The intensity of the UV emitted light ($\lambda$=300 nm) of the light-emitting device having a roughened surface was compared with the intensity of the emitted light from a light-emitting element not subjected to surface roughening. As a result, the device having the roughened surface showed about 30% of improvement in luminance as compared with the light-emitting device having no roughened surface. In this way, it was confirmed that the structure obtained in the invention is effective for enhancing luminance even in the UV region.

Example 17

A white light was emitted by mounting a fluorescent substance on the UV-LED having a roughened surface on the light emitted surface as described in Example 16. The fluorescent substances used are listed in Table 11.

TABLE 11

| Fluorescent substance | Color: Wavelength | Composition ratio |
|---|---|---|
| ZnS: Cu, Al | Green: λ = 530 nm | 22.8% |
| Y2O2S: Eu | Red: λ = 626 nm | 55.8% |
| BaNgA11017: Eu | Blue: λ = 454 nm | 21.4% |

The fluorescent substance was formed into a thin film on the light-emitting surface of LED, and the element was sealed with an epoxy resin. Luminance of the white light of this LED device was compared with luminance of the LED device having no roughened structure on the surface, finding that luminance of LED having the roughened surface was 25% as high as luminance of the device having no roughened surface. As a result, it was confirmed from this result that the structure obtained in the invention is effective in the white LED using the fluorescent substance.

According to the invention, the mean diameter of the projections on the roughened surface is formed to be smaller than the wavelength of the emitted light, and the pitch between the projections has some distribution in order to form a smooth gradient of the refractive index at the position of the top and bottom of the roughened surface. The surface has a nanometer size of a roughened structure having a mean pitch smaller than the wavelength, thereby exhibiting a high luminous efficiency of the light-emitting device.

A composition comprising a block copolymer or graft copolymer has a nanometer size of microphase-separated structures that are spontaneously organized. At least one phase of the phase-separated structures formed on the surface is selectively removed, and the remaining phase is used for etching the light-emitting element, thereby enabling the light-emitting element having a roughened surface without using any exposure apparatus to realize high productivity.

What is claimed is:

1. A method for manufacturing a light-emitting device comprising:
    forming a thin film on a surface of a light-emitting element with a resin composition which comprises a block copolymer or graft copolymer and having a number average molecular weight of from at least 100,000 to at most 10,000,000 that forms a microphase-separated structure in a self-organization manner;
    selectively removing at least one phase of the microphase separated structure of the thin film formed on the surface of the light-emitting element;
    etching the surface of the light-emitting element using the remaining phase as an etching mask.

2. The method for manufacturing a light-emitting device according to claim 1, wherein the resin composition comprises a block copolymer and the ratio of weight average molecular weight and number average molecular weight (Mw/Mn) of the block copolymer is 1.2 or less.

3. The method for manufacturing a light-emitting device according to claim 1, wherein the block copolymer and the graft copolymer is manufactured by living anion polymerization.

4. The method for manufacturing a light-emitting device according to claim 1 wherein, in at least two kinds of polymer chains comprise the block copolymer and the graft copolymer, and the $N/(N_c-N_o)$ ratio of monomer units forming the respective polymer chains is 1.4 or more,
    where N represents the total number of atoms in the monomer unit, $N_c$ represents the number of carbon atoms in the monomer unit, and $N_o$ represents the number of oxygen atoms in the monomer unit.

5. The method for manufacturing a light-emitting device according to claim 4, wherein the block copolymer and the graft copolymer is a copolymer of styrene and methyl methacrylate.

6. The method for manufacturing a light-emitting device according to claim 5, said resin composition further comprising at least one low molecular weight homopolymer selected from the group consisting of polymethyl methacrylate, polystyrene and mixtures thereof.

7. A method for manufacturing a light-emitting device comprising:
    forming a thin film on a surface of a light-emitting element with a resin composition which comprises a block copolymer or graft copolymer that forms a microphase-separated structure in a self-organizational manner; wherein at least two kinds of polymer chains comprise the block copolymer and the graft copolymer, and the $N/(N_c-N_o)$ ratio of monomer units forming the respective polymer chains is 1.4 or more,
    where N represents the total number of atoms in the monomer unit, $N_c$ represents the number of carbon atoms in the monomer unit, and $N_o$ represents the number of oxygen atoms in the monomer unit;
    selectively removing at least one phase of the microphase separated structure of the thin film formed on the surface of the light-emitting element;
    etching the surface of the light-emitting element using the remaining phase as an etching mask.

8. A method for manufacturing a light-emitting device comprising:
    forming a thin film on a surface of a light-emitting element with a resin composition which is obtained by adding low molecular weight homopolymers to a block copolymer or graft copolmer that forms a microphase-separated structure in a self-organization manner;
    selectively removing at least one phase of the microphase separated structure of the thin film formed on the surface of the light-emitting element;
    etching the surface of the light-emitting element using the remaining phase as an etching mask.

9. The method for manufacturing a light-emitting device according to claim 8, wherein the low molecular weight homopolymer is one of the homopolymer forming the block copolymer and the graft copolymer.

10. The method for manufacturing a light-emitting device according to claim 7, wherein the molecular weight Mw of the low molecular weight homopolymer is from at least 1000 to at most 30,000.

11. The method for manufacturing a light-emitting device according to claim 10, wherein the low molecular weight homopolymer is selected from the group consisting of polymethyl methacrylate, polystyrene and mixtures thereof.

12. A method for manufacturing a light-emitting device comprising:
    forming a thin film on a surface of a substrate with a resin composition which comprises a block copolymer or graft copolymer having a number average molecular weight of from at least 100,000 to at most 10,000,000 that forms a microphase-separated structure in a self-organizational manner;
    selectively removing at least one phase of the microphase separated structure of the thin film formed on the surface of the substrate;
    etching the surface of the substrate using the remaining phase as an etching mask.

13. A method for manufacturing a light-emitting device comprising:

forming a thin film on a surface of a substrate with a resin composition which comprises a block copolymer or graft copolymer that forms a microphase-separated structure in a self-organizational manner, wherein at least two kinds of polymer chains comprise the block copolymer and graft copolymer, and the $N/(N_c-N_o)$ ratio of monomer units forming the respective polymer chains is 1.4 or more, where $N$ represents the total number of atoms in the monomer unit, $N_c$ represents the number of carbon atoms in the monomer unit, and $N_o$ represents the number of oxygen atoms in the monomer unit;

selectively removing at least one phase of the microphase separated structure of the thin film formed on the surface of the substrate;

etching the surface of the substrate using the remaining phase as an etching mask.

14. A method for manufacturing a light-emitting device comprising:

forming a thin film on a surface of a substrate with a resin composition which is obtained by adding low molecular weight homopolymers to a block copolymer or graft copolymer that forms a microphase-separated structure in a self-organizational manner;

selectively removing at least one phase of the microphase separated structure of the thin film formed on the surface of the substrate;

etching the surface of the substrate using the remaining phase as an etching mask.

* * * * *